United States Patent
Birner et al.

(10) Patent No.: US 9,929,107 B1
(45) Date of Patent: Mar. 27, 2018

(54) METHOD FOR MANUFACTURING A SEMICONDUCTOR DEVICE

(71) Applicant: Infineon Technologies AG, Neubiberg (DE)

(72) Inventors: Albert Birner, Regensburg (DE); Helmut Brech, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/370,536

(22) Filed: Dec. 6, 2016

(51) Int. Cl.
| | | |
|---|---|---|
| *H01L 21/00* | (2006.01) | |
| *H01L 23/00* | (2006.01) | |
| *H01L 29/20* | (2006.01) | |
| *H01L 29/205* | (2006.01) | |
| *H01L 29/778* | (2006.01) | |
| *H01L 23/48* | (2006.01) | |
| *H01L 21/768* | (2006.01) | |
| *H01L 29/66* | (2006.01) | |

(52) U.S. Cl.
CPC ...... *H01L 23/562* (2013.01); *H01L 21/76898* (2013.01); *H01L 23/481* (2013.01); *H01L 24/48* (2013.01); *H01L 29/2003* (2013.01); *H01L 29/205* (2013.01); *H01L 29/66462* (2013.01); *H01L 29/7787* (2013.01); *H01L 2924/1033* (2013.01); *H01L 2924/10344* (2013.01); *H01L 2924/13064* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 8,169,035 B2 | 5/2012 | Takada et al. | |
| 2006/0226415 A1* | 10/2006 | Nishijima | G01S 7/032 |
| | | | 257/11 |
| 2006/0278981 A1 | 12/2006 | Trezza et al. | |
| 2008/0210977 A1 | 9/2008 | Okita | |
| 2009/0001478 A1* | 1/2009 | Okamoto | H01L 21/76898 |
| | | | 257/382 |
| 2010/0084747 A1* | 4/2010 | Chen | H01L 21/6835 |
| | | | 257/621 |
| 2014/0353837 A1 | 12/2014 | Watanabe | |
| 2015/0349105 A1 | 12/2015 | Curatola et al. | |
| 2017/0154850 A1 | 6/2017 | Kao et al. | |

FOREIGN PATENT DOCUMENTS

WO    2016054545 A1    4/2016

\* cited by examiner

*Primary Examiner* — Angel Roman
(74) *Attorney, Agent, or Firm* — Murphy, Bilak & Homiller, PLLC

(57) ABSTRACT

In an embodiment, a method includes forming an opening in a front surface of a substrate including at least one Group III nitride-based transistor on the first surface, inserting conductive material into the opening, and coupling a source electrode of the Group III nitride-based transistor to a rear surface of the substrate with the conductive material.

20 Claims, 20 Drawing Sheets

A-A

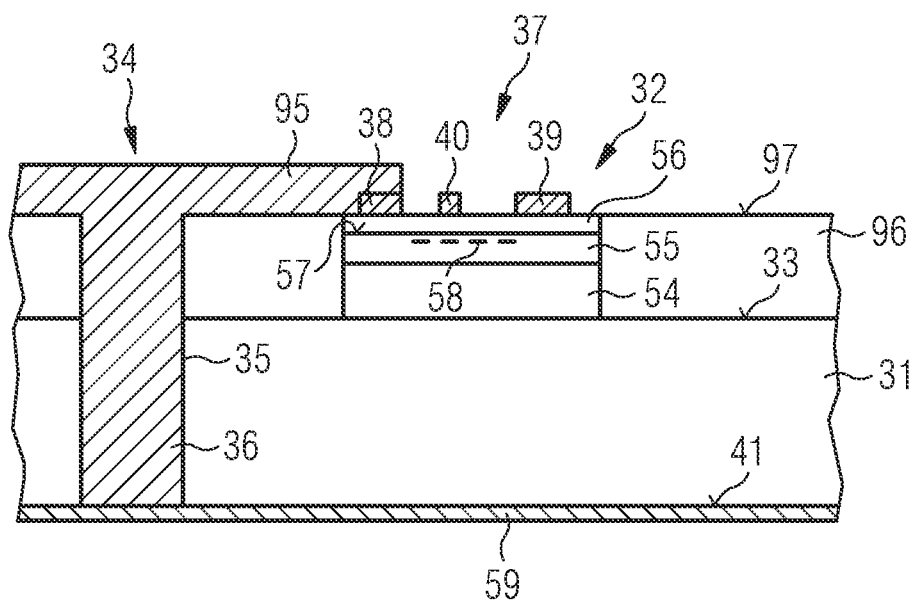

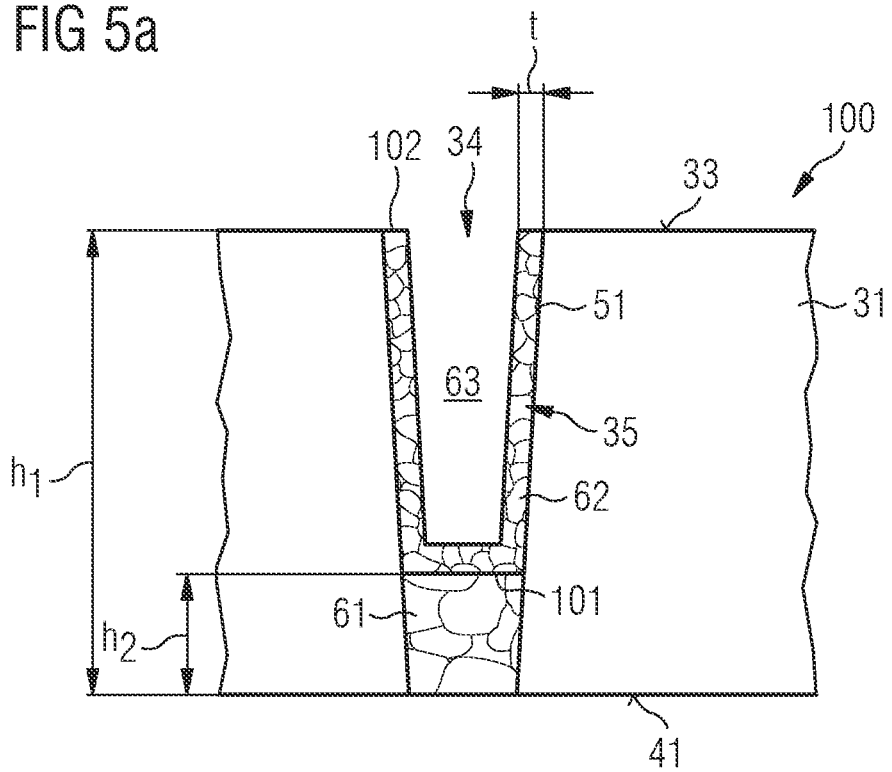
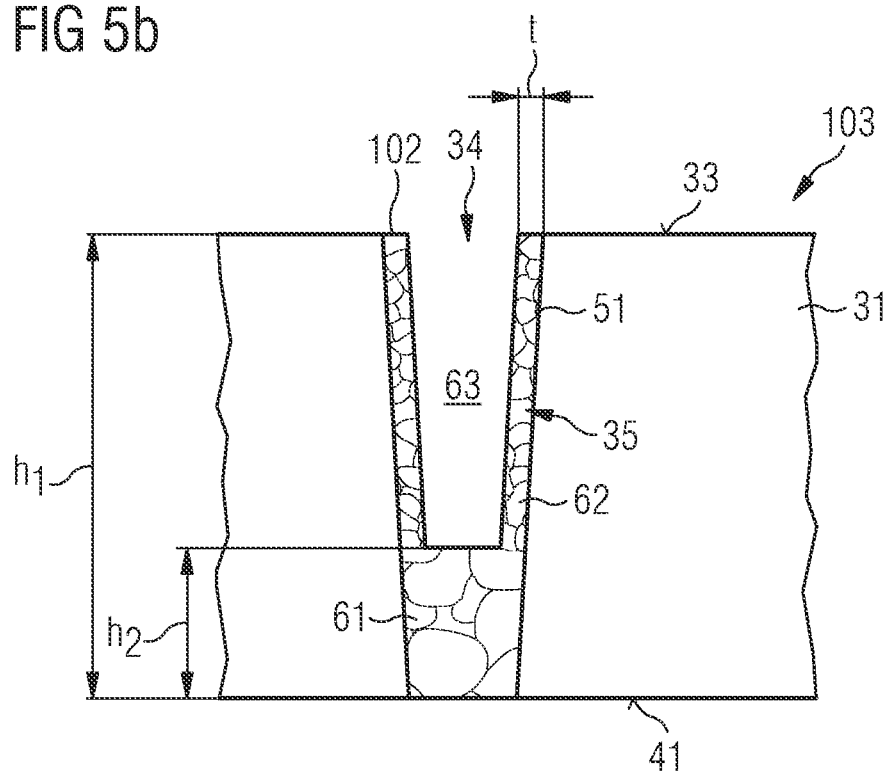

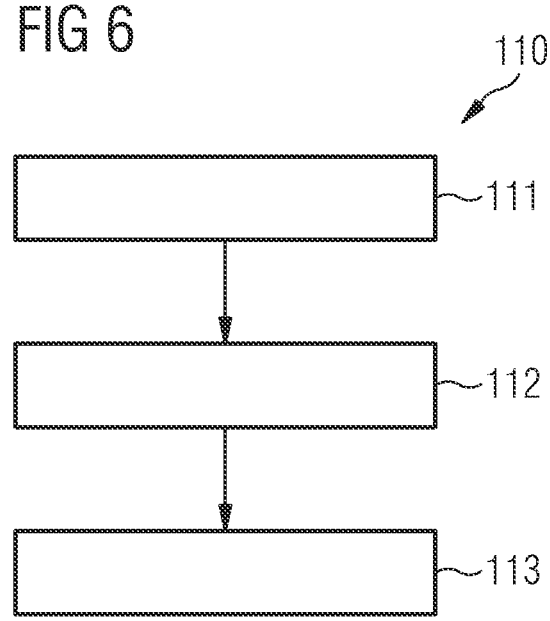
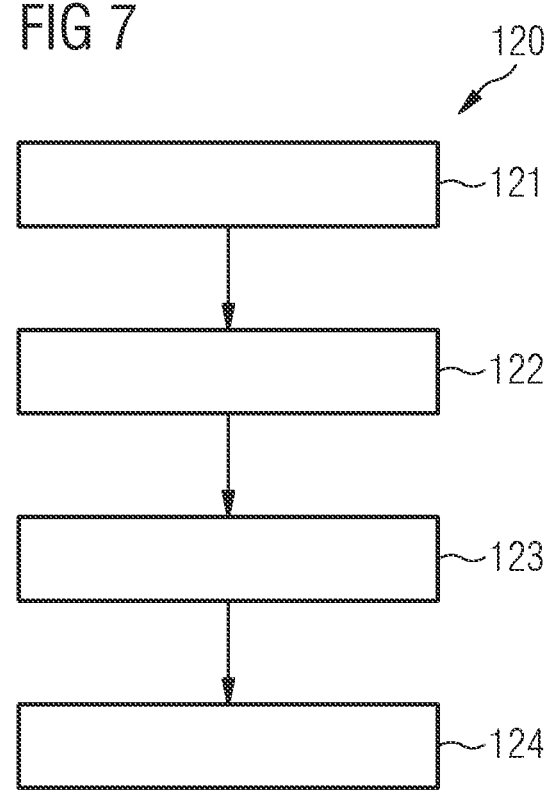

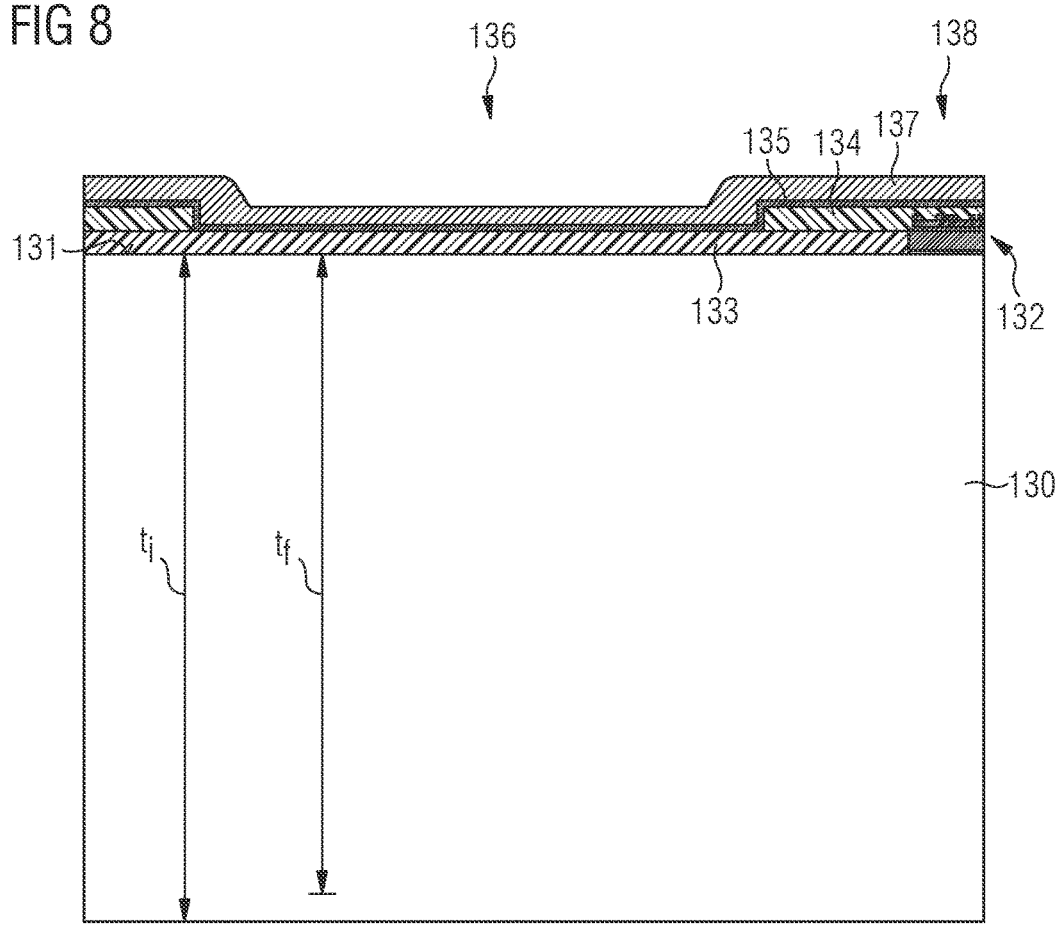

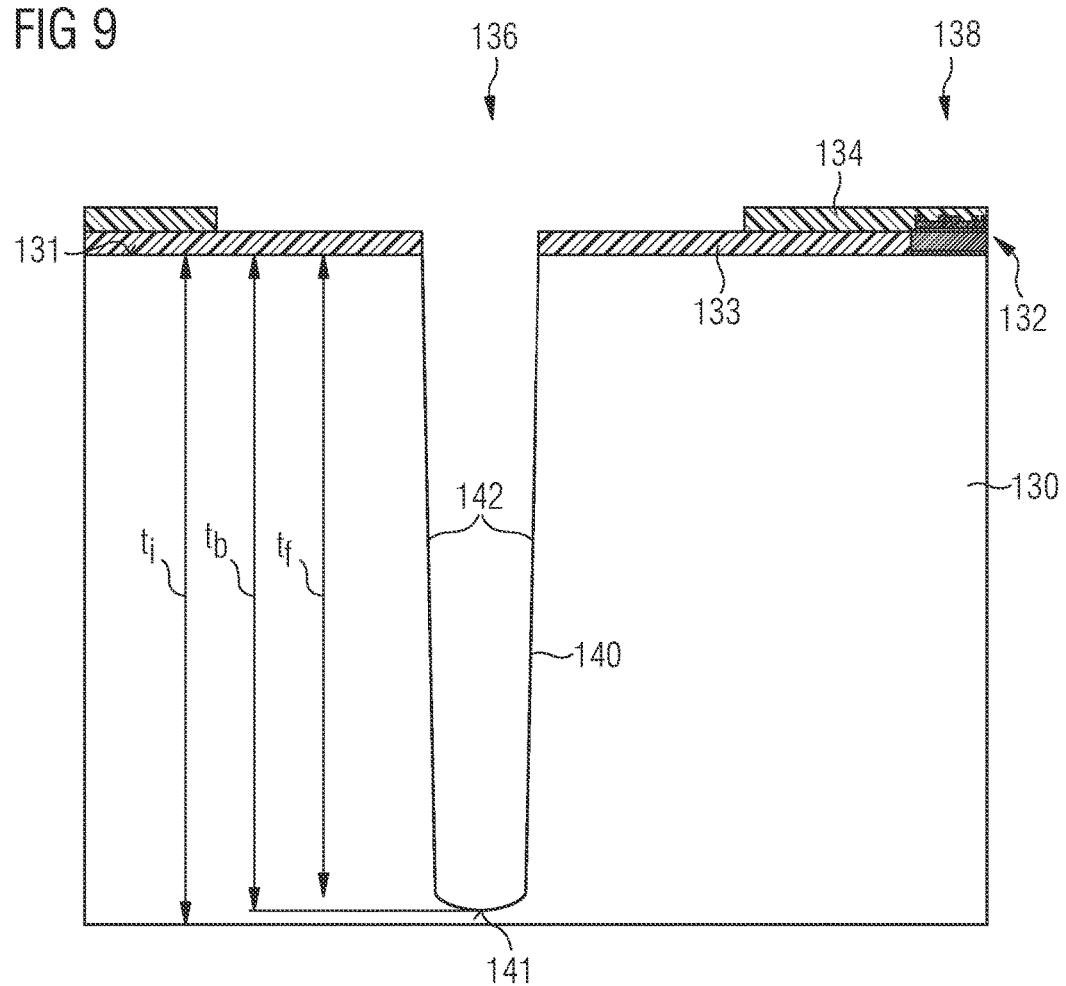

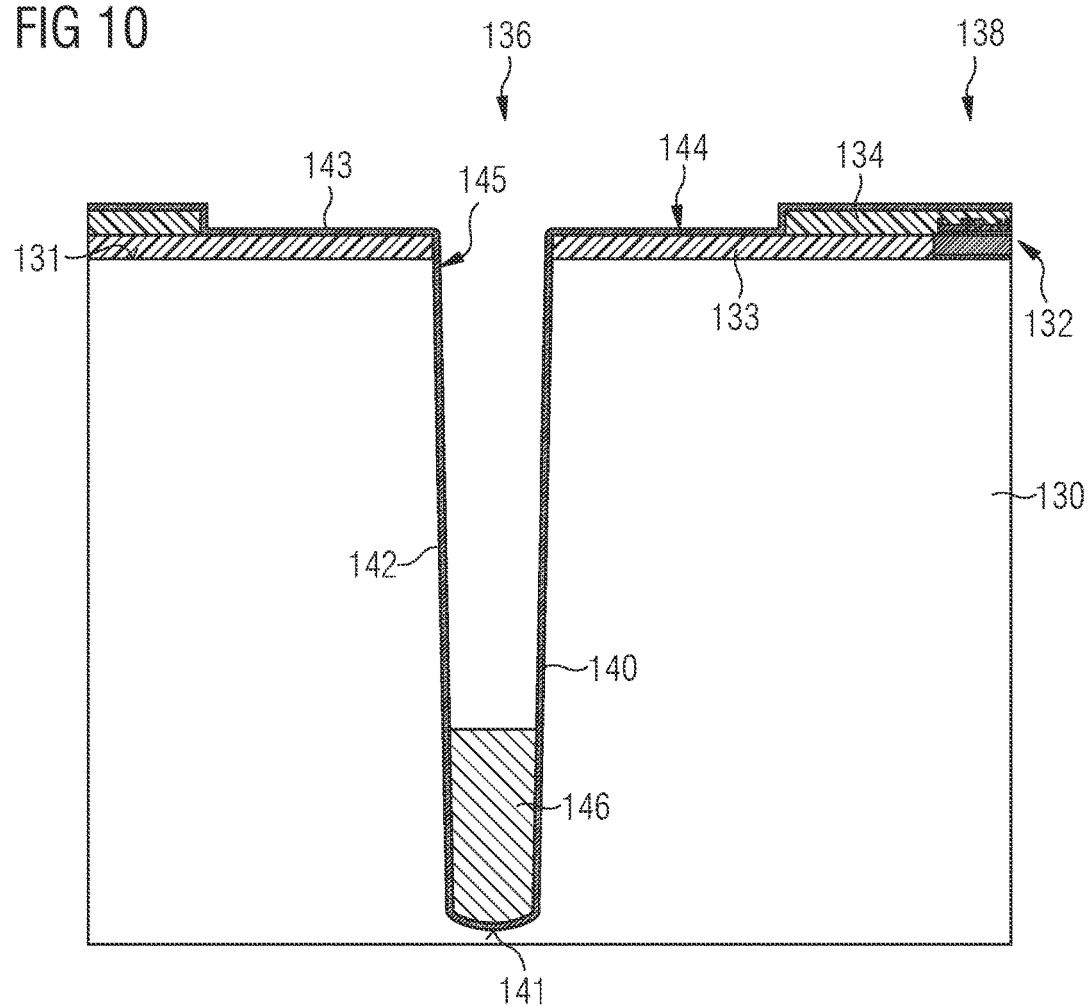

US 9,929,107 B1

METHOD FOR MANUFACTURING A SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III nitride-based semiconductor devices, such as gallium nitride (GaN) devices, are now emerging as attractive candidates to carry large current densities, support high breakdown voltages and to provide very low on-resistance, ultra-fast switching times and improved power efficiency.

In some lateral transistor devices, such as a gallium nitride-based High Electron Mobility Transistor (HEMT), the source is coupled to the rear side of the substrate on which the transistor structure is formed. The source may be coupled by a conductive through substrate via (TSV) to the rear surface of the substrate.

Further improvements to the connection between the source and the rear surface of the substrate are desirable.

SUMMARY

In an embodiment, a method includes forming an opening in a front surface of a substrate including at least one Group III nitride-based transistor on the first surface, inserting conductive material into the opening, and coupling a source electrode of the Group III nitride-based transistor to a rear surface of the substrate with the conductive material.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 4c illustrates a cross-sectional view of a connection between a conductive through substrate via and a Group III nitride-based transistor.

FIG. 5a illustrates a cross-sectional view of the conductive through substrate via of FIGS. 2b and 3b.

FIG. 5b illustrates a cross-sectional view of the conductive through substrate via of FIGS. 2b and 3b.

FIG. 6 illustrates a flow chart of a method for fabricating a conductive through substrate via.

FIG. 7 illustrates a flow chart of a method for fabricating a Group III nitride-based transistor device with a conductive through substrate via.

FIG. 8 illustrates a cross-sectional view of an initial semiconductor substrate.

FIG. 9 illustrates a cross-sectional view of the initial semiconductor substrate of FIG. 8 with a blind via.

FIG. 10 illustrates a cross-sectional view of a conductive plug at the base of the blind via of FIG. 9.

DETAILED DESCRIPTION

Figure 1:
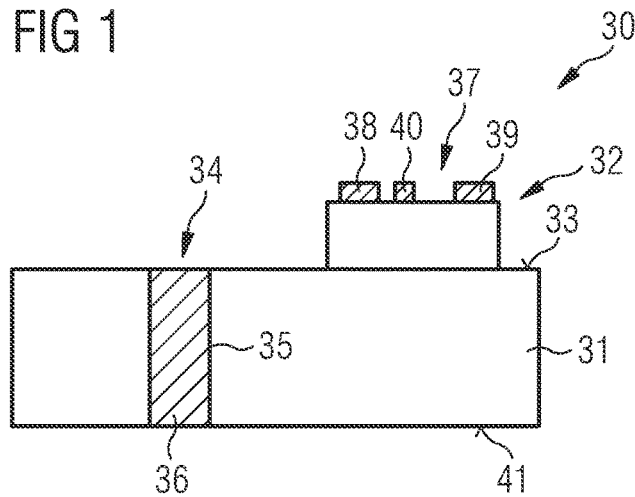
FIG. 1 illustrates a cross-sectional view of a semiconductor device including a Group III nitride-based transistor and a conductive through substrate via (TSV).

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

FIG. 1 illustrates a semiconductor device 30 including a substrate 31 and a Group III nitride-based transistor 32, such as a High Electron Mobility Transistor (HEMT), arranged on the front surface 33 of the substrate 31. The semiconductor device 30 also includes at least one conductive through substrate via (TSV) 34.

The conductive through substrate via 34 includes a via or through-hole 35 which extends from the front surface 33 to a rear surface 41 of the substrate 31 and conductive material 36 which also extends from the front surface 33 to the rear surface 41.

The conductive material 36 may be electrically coupled to the Group III nitride-based transistor 32, for example, to an electrode such as a source electrode of the Group III nitride-based transistor 32, to enable Group III nitride-based transistor to be electrically coupled to the rear surface 41 of the substrate 31. The conductive through substrate via 34 is formed by introducing the via 35 into the front surface 33 of the substrate 31 adjacent the Group III nitride-based transistor 32. Introducing the via 35 from the front surface 33 enables the via 35 to be formed by processing the side of the substrate 31 on which the Group III nitride-based transistor 32 is arranged. This may be used to assist a better positioning of the via 35 with respect to the Group III nitride-based transistor 32 and to assist the electrical coupling of the conductive material 36 with the Group III nitride-based transistor 32.

The substrate 31 includes a front surface 33 which is capable of supporting the epitaxial growth of at least one Group III nitride layer. The substrate 31 may include a semiconductor wafer such as a <100> silicon wafer or <111> silicon wafer, silicon carbide or sapphire. The Group III nitride-based transistor 32 may include a plurality of Group III nitride layers epitaxially grown on the front surface 33.

The Group III nitride-based transistor 32 may have different structures. In some embodiments, the Group III nitride-based transistor 32 is provided by a mesa 37 or discrete area including a plurality of Group III nitride layers which provide a single switching device. At least side faces of the mesa 37 may be embedded in an insulation layer, such as a $SiO_2$ layer.

At the wafer level, the substrate 31 may include a plurality of mesas 37, each providing a Group III nitride-based transistor device 32, which are spaced apart from one another on the front surface 33. The mesas 37 may have side faces embedded in a common insulation layer. In some embodiments, the conductive through substrate via 34 is arranged adjacent and spaced apart from the mesa 37 including the Group III nitride-based transistor by a portion of the substrate 31 and the insulation layer.

In other embodiments, the Group III nitride-based transistor and the conductive through substrate via are formed in a plurality of epitaxial Group III nitride layers which extend across the front surface of the substrate. The Group III nitride-based transistor may be one transistor cell of a plurality of transistor cells coupled in parallel. The conductive though substrate via may be arranged within the cell field.

The conductive through substrate via 34 may have various forms. For example, the conductive material 36 may substantially fill the via 35, partially fill the via 35 or line the via 35. The conductive though substrate via 34 may have different lateral forms. For example, the conductive through substrate via may have a laterally elongate shape, such as a substantially rectangular form, or may have a square, circular or hexagonal lateral shape.

Figure 2A:
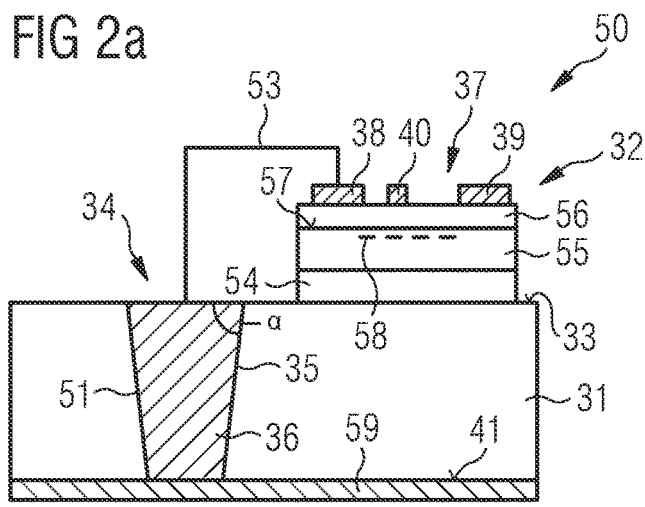
FIG. 2a illustrates a cross-sectional view of a semiconductor device including a Group III nitride-based transistor and a conductive through substrate via (TSV).

FIG. 2a illustrates a semiconductor device 50 including the substrate 31, the Group III nitride-based transistor 32 formed in a mesa 37 on the front surface 33 of the substrate 31 and the conductive through substrate via 34.

In some embodiments, such as that illustrated in FIG. 2a, the via 35 tapers from the front surface 33 to the rear surface 41 of the substrate 31 such that the lateral area of the via 35 is larger at the front surface 33 than at the rear surface 41 of the substrate 31.

The sidewalls 51 of the conductive through substrate via 34 may be inclined at an angle α of between 86° to 89° with respect to the front surface 33 of the substrate 31 to form the taper. The tapering may be formed as a result of the via 35 being introduced into the substrate 31 from the front surface 33. The via 35 may be formed by etching, such as plasma etching.

In some embodiments, the via 35 is substantially filled by the conductive material 36, as is illustrated in FIG. 2a, for example. In these embodiments, the conductive material has a larger lateral area at the front surface 33 of the substrate 31 than at the rear surface 41 of the substrate 31.

The conductive material 36 and, therefore the conductive through substrate via 34, may be electrically coupled to the source electrode 38 of the Group III nitride-based transistor 32, as is schematically indicated by the line 53 in FIG. 2a.

The Group III nitride-based transistor 32 and the mesa 37 may include a semiconductor structure including a plurality of epitaxial Group III nitride-based layers. The mesa 37 may include a buffer structure 54 including one or more epitaxial Group III nitride-based layers, a channel layer 55 arranged on the buffer structure 54 and a barrier layer 56 arranged on the channel layer 55. The channel layer 55 may include gallium nitride (GaN) and the barrier layer 56 may include aluminium gallium nitride ($Al_xGa_{(1-x)}N$, where 0<x<1) to form a heterojunction at the interface 57 between the channel layer 55 and the barrier layer 56 which is capable of supporting a two dimensional charge gas, for example a two dimensional electron gas (2DEG) or two-dimensional hole gas (2DHG), as is indicated with the dotted line 58. The Group III nitride-based transistor 32 includes a source electrode 38, a drain electrode 39 and a gate electrode 40 arranged on the barrier layer 56. The gate electrode 40 is arranged laterally between the source electrode 38 and the drain electrode 39.

The two-dimensional charge gas such as a two-dimensional electron gas (2DEG) may be formed by piezoelectric and spontaneous polarization at the interface between the channel layer 55 and the barrier layer 56. The Group III nitride-based transistor 32 may be a High Electron Mobility Transistor (HEMT) and may have a breakdown voltage of at least 200V.

A conductive layer 59 is arranged on the rear surface 41 of the substrate 31 and may have a solderable surface or include solder to enable the semiconductor substrate 31 to be mounted on, and electrically coupled to, a die pad or ground plane of a package. The conductive layer 59 may include two or more sublayers, for example a metallic layer and a solderable layer.

Figure 2B:
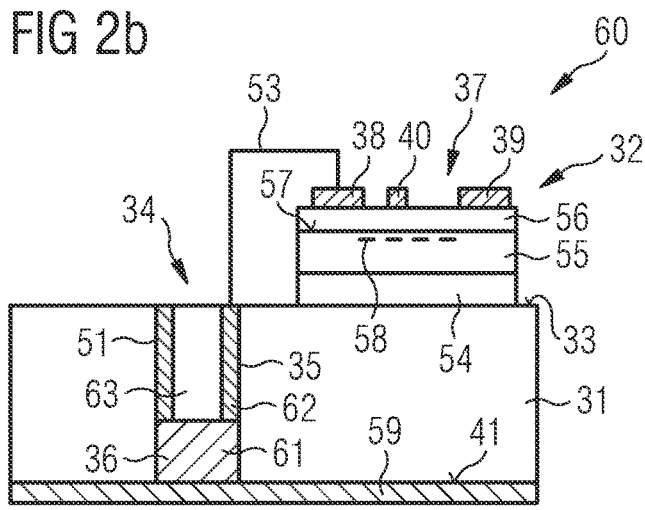
FIG. 2b illustrates a cross-sectional view of a semiconductor device including a Group III nitride-based transistor and a conductive through substrate via (TSV).

FIG. 2b illustrates a semiconductor device 60 including the Group III nitride-based transistor 32 formed in a mesa 37 arranged on the front surface 33 of the substrate 31 and at least one conductive through substrate via 34.

The conductive through substrate via 34 differs from that illustrated in FIG. 2a in the arrangement of the conductive material 36 within the via 35. In this embodiment, a first portion of the via 35 adjacent the rear surface 41 of the substrate 31 includes a conductive plug 61 which substantially fills the base of the via 35. A conductive liner layer 62 is also provided which lines sidewalls 51 of the via 35 in a second portion of the via 35 adjacent the front surface 33 substrate 31. The conductive liner layer 62 surrounds a gap 63 in the upper portion of the via 35. The conductive liner layer 62 is arranged on at least peripheral regions of the conductive plug 61 such that the conductor plug 61 and conductive liner layer 62 provide an electrically conductive path from the front surface 33 to the rear surface 41 the substrate 31.

The via 35 may also taper from the front surface 33 to the rear surface 41 such that the narrower base of the via 35 is substantially filled with conductive material and such that a wider region of the via 35 adjacent the front surface 33 includes a gap 63 defined by the conductive liner layer 62 and upper surface of the conductive plug 61.

The substrate 31 may have a height $h_1$ and the first conductive portion 61 may have a height $h_2$, wherein $h_2 \leq 2h_1/3$. As an example, 20 µm≤$h_1$≤100 µm and 5 µm≤$h_2$≤70 µm.

The second conductive portion 62 may have a thickness t, for example 0.5 µm≤t≤3 µm, and the first conductive portion 61 may have a height $h_2$, for example 5 µm≤$h_2$≤70 µm.

A multilayer liner structure may be provided between the conductive material 36 and the side walls of the through substrate via 35. The multilayer liner structure may be in direct contact with the substrate 31 and provide adhesion and/or barrier functions.

In some embodiments, a portion of the front surface 33 of the substrate 31 is also removed in the regions neighbouring the mesa 37 such that the mesa 37 is positioned on a raised region of the substrate 41.

The mesa 37 may have a height in the range of 1 µm to 10 µm and have lateral dimensions suitable for forming a semiconductor device, such as a HEMT, or active region of a semiconductor device.

In the illustrated embodiment, the mesa 37 has the form of a discrete protrusion having side faces which may be embedded in an insulation layer. However, in other embodiments, the protruding structures providing mesas for semiconductor devices may be connected to neighbouring protruding regions by portions including one or more Group III nitride layers.

The formation of discrete mesas 37 on the front surface may be used to assist in decreasing wafer bowing and to simplify manufacturing. One or more Group III nitrides epitaxially grown over the entire surface of a wafer, such as a single crystal silicon wafer, may result in bowing of the wafer due to the highly compressive or tensile individual epitaxial Group III nitride layer(s) and due to the high in-plane lattice mismatch and difference in thermal coefficient of expansion between the Group III nitride layer and the substrate. Wafer bow values of up to 200 µm at the centre for a 200 mm wafer may occur. As a consequence, these wafers may exhibit fragility during processing in a semiconductor production line.

However, if the majority of the material arranged on the upper surface of the semiconductor wafer includes insulating material rather than epitaxially deposited Group III nitride layers. The total area occupied by the Group III nitride containing regions on the upper surface of the wafer may lie within 10% to 90% of the total area of the wafer. Consequently, this arrangement may be used to decrease any bow of the semiconductor wafer in order to assists in the automatic handling of the semiconductor wafer in subsequent processing steps.

The wafer may have a wafer bow b of less than 200 μm, wherein:

$$100*t*b/d^2 \leq 15$$

wherein d is wafer diameter, t is thickness of the epitaxially deposited Group III nitride layers and b is wafer bow at centre of the wafer.

The diameter d may be 200 mm and the thickness t may be 1 μm to 10 μm. A wafer of 200 mm diameter may have a thickness of around 725 μm. The mesas 37 may have a surface planarity variation of less than ±10% of the mesa height over a wafer diameter of 200 mm, also for mesas having height of 0.5 μm to 10 μm.

In some embodiments, the Group III nitride-based transistor and the conductive through substrate via may be formed in a continuous semiconductor structure including a plurality of epitaxial Group III nitride layers. In these embodiments, the conductive through substrate via is arranged in, and may be in direct contact with, the epitaxial Group III nitride layers in which the transistor structure is formed.

Figure 3A:
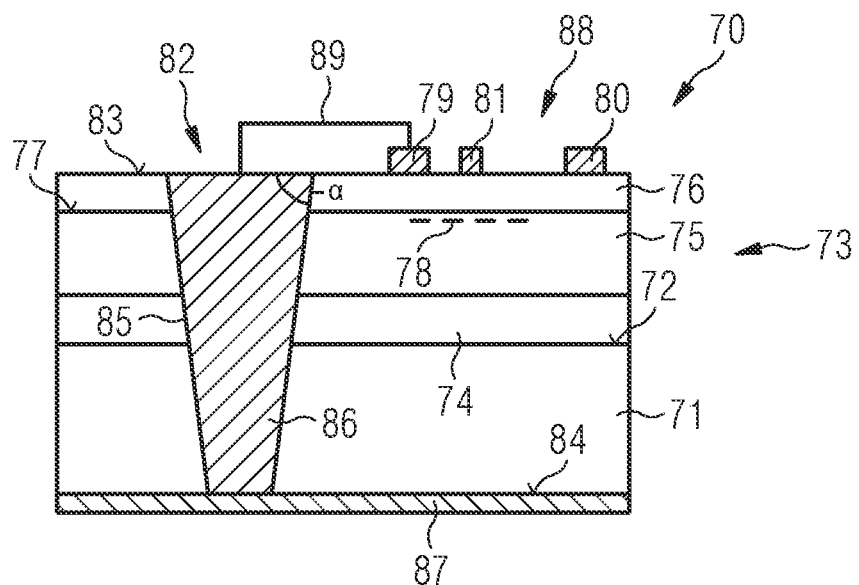
FIG. 3a illustrates a cross-sectional view of a semiconductor device including a Group III nitride-based transistor and a conductive through substrate via (TSV).

FIG. 3a illustrates a cross-sectional view of a semiconductor device 70 including a substrate 71 having a front surface 72 which is capable of supporting the epitaxial growth of one or more Group III nitrides. The substrate 71 may include a semiconductor substrate, for example a semiconductor wafer such as a <100> or <111> silicon wafer, silicon carbide or sapphire. A plurality of Group III layers is epitaxially grown on the front surface 32 to form a semiconductor structure 73. The semiconductor substrate 73 may include a buffer or transition structure 74 arranged on the front surface 72, a channel layer 75 including gallium nitride arranged on the buffer structure 74 and a barrier layer 76 including aluminium gallium nitride ($Al_xGa_{(1-x)}N$, where 0<x<1) arranged on the channel layer 75 so as to form a heterojunction at the interface 77 between the barrier layer 76 and the channel layer 75 which is capable of supporting a two-dimensional charge gas such as two-dimensional electron gas (2DEG) or two-dimensional hole gas (2DHG), indicated with the dotted line 78 in FIG. 3a.

The Group III nitride-based transistor is formed in a portion of a semiconductor structure 73 by a source electrode 79, a drain electrode 80 and a gate electrode 81 arranged on the barrier layer 76 such that the gate electrode 81 is arranged laterally between the source electrode 79 and the drain electrode 80. The electrodes 79, 80, 81 may form a transistor cell or segment 88 which is one of a plurality of transistor cells electrically coupled in parallel to form a single switching device. The source electrode 79, drain electrode 80 and gate electrode 91 may have an elongate strip-like form, each having a length which extends into the plane of the drawing. The source electrode 79, drain electrode 80 and gate electrode 91 may include one or more metals.

The semiconductor device 70 also includes at least one conductive through substrate via 82 which extends through the semiconductor structure 73 including the epitaxial Group III nitride layers and the substrate 71 such that it extends from an upper surface 83 of the outermost surface of the semiconductor structure 73 which, in this embodiment, is provided by the barrier layer 76, to the rear surface 84 of the substrate 71. The conductive through substrate via 82 includes a via 85 which extends from upper surface 83 to the rear surface 84 and conductive material 86 which extends from the upper surface 83 to the rear surface 84. A conductive layer 87 is arranged on the rear surface 84 which is electrically coupled to the conductive material 86 within the conductive through substrate via 82.

The conductive through substrate via 82 may be coupled to an electrode of the Group III nitride-based transistor 88 as is indicated schematically in FIG. 3a by the line 89. In particular, the conductive through substrate via 82 may be electrically coupled to the source electrode 79 of the transistor 88. In some embodiments, the conductive through substrate via 82 is electrically coupled to two neighbouring transistor cells 88 arranged on opposing sides of the conductive through substrate via 82 on the front surface 72.

The conductive through substrate via 82 may also have different forms. In the embodiment illustrated in FIG. 3a, the via 85 has a tapering form such that side walls 95 are inclined at an angle α of around 86° to 89° with respect to the upper surface 83. The lateral area of the via 85 at the upper surface 83 is larger than the lateral area of the via 85 at the rear surface 84. The via 85 may be substantially filled with conductive material 86, as is illustrated in FIG. 3a. In other embodiments, the conductive through substrate via 85 includes a gap or unfilled region in at least a portion of the via 85. In some embodiments, the sidewalls 95 are lined with conductive material such that a gap extends from the upper surface 83 to the rear surface 84.

Figure 3B:
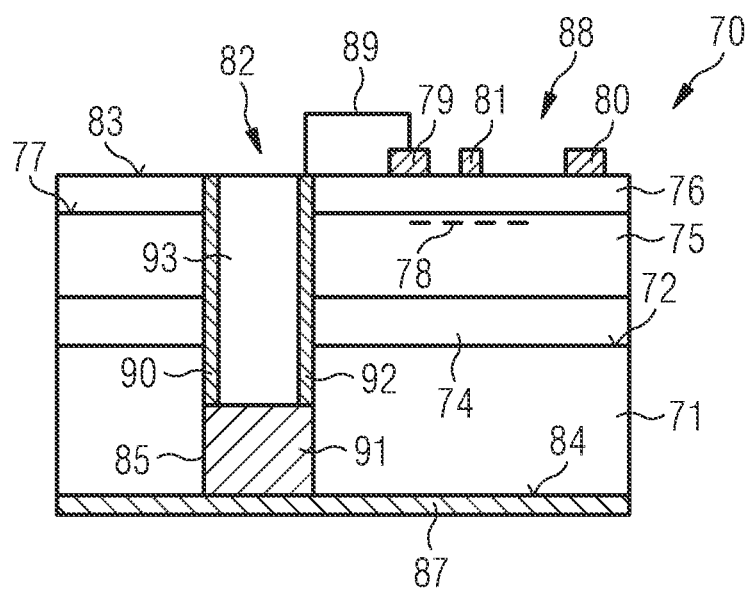
FIG. 3b illustrates a cross-sectional view of a semiconductor device including a Group III nitride-based transistor and a conductive through substrate via (TSV).

In some embodiments, such as that illustrated in FIG. 3b, the base of the via 85 is substantially filled with conductive material forming a conductive plug 91 whereas the upper portion of the via 85 includes a conductive liner layer 92 which lines the sidewalls 90 of the via 85 leaving a gap 93 in the centre of the via 85. The via 85 may also taper from the upper surface 83 to the rear surface 84 in embodiments in which the via 85 is partially filled with conductive material 86 so that the via has a larger lateral area at the upper surface 83 than at the rear surface 84.

A multilayer liner structure may be provided between the conductive material 86 and the side walls of the through substrate via 85.

The conductive through substrate via according to the embodiments described herein may have different lateral forms. For example, the conductive through substrate via 82 may have an elongate lateral area, for example rectangular, or may have a square, circular or hexagonal lateral shape.

A plurality of conductive through substrate vias may be arranged in a row or an array which extends substantially parallel to the source electrode 79 of the Group III nitride-based transistor 88. Two or more conductive through substrate vias may also be politically coupled to a common electrode of the Group III nitride-based transistor.

However, the Group III nitride-based transistor 32, 88 is not limited to the illustrated arrangements and may have other arrangements. For example, a cap layer including gallium nitride (GaN) may be arranged on the barrier layer. One or more insulation and/or passivation layers may be arranged on the barrier layer. The gate may include a gate recess structure and/or a p-doped Group III nitride layer may be arranged underneath the gate. The source and/or drain contacts may include a recessed structure, for example to minimise the ohmic contact resistance.

The Group III nitride-based transistor 32, 88 may be a HEMT and may be a depletion mode device which is normally on. The metal gate forms a Schottky barrier contact and the source and drain form an ohmic metal contact. The Group III nitride-based transistor 32, 88 may also be an enhancement mode device which is normally off. The Group III nitride-based transistor 32, 88 may be a high-voltage device, for example have a blocking voltage capability of at least 600V.

The conductive through substrate via may be coupled to the source electrode of the Group III nitride-based transistor in various ways, for example, by one or more bond wires or by a portion of a metallization structure arranged on the front surface of the substrate.

Figure 4A:
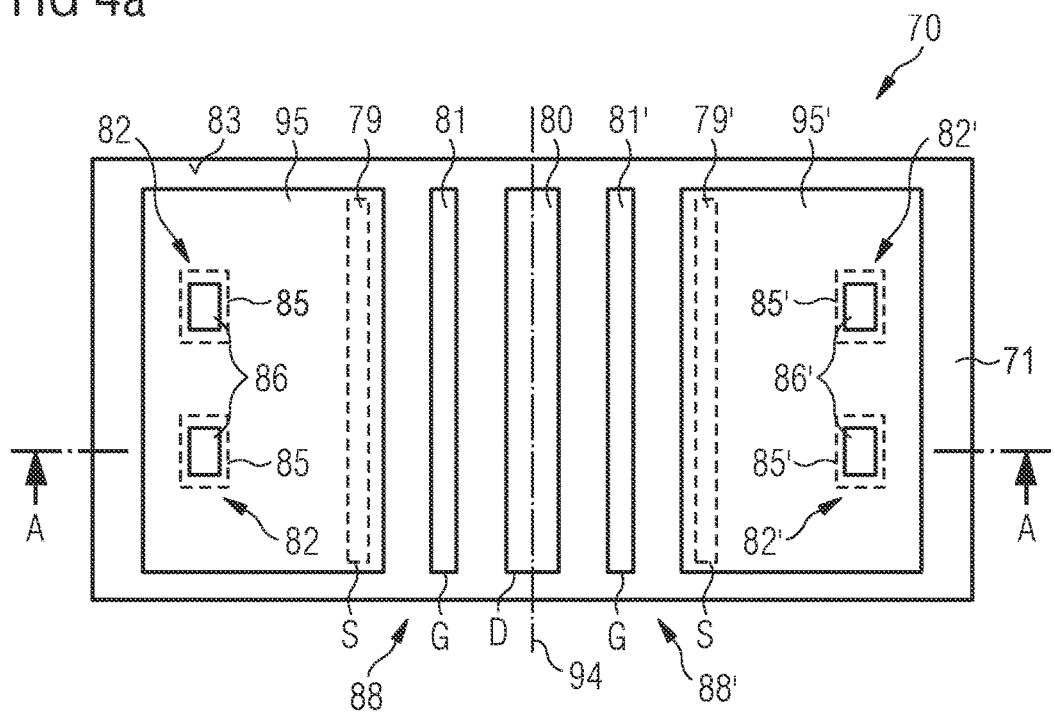
FIG. 4a illustrates a plan view of the semiconductor device of FIG. 3b and a connection between a conductive through substrate via and a Group III nitride-based transistor.
Figure 4B:
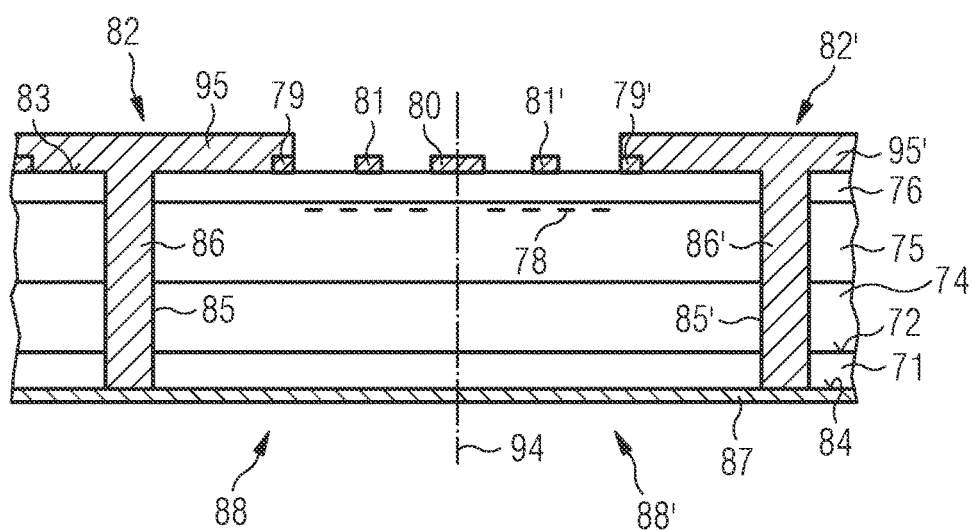
FIG. 4b illustrates a cross-sectional view along the line A-A of FIG. 4a and the connection between the conductive through substrate via and the Group III nitride-based transistor.

FIG. 4a illustrates a plan view and FIG. 4b a cross-sectional view along the line A-A of the semiconductor device 70 and illustrates two neighbouring transistor cells 88, 88' FIGS. 4a and 4b also illustrate an embodiment of an electrical connection between the source electrode 79 and the conductive through substrate via 82.

The Group III nitride-based transistor 70 includes a plurality of transistor cells or segments 88 which are coupled in parallel with one another. FIGS. 4a and 4b illustrates two transistor cells 88, 88' which have a symmetric arrangement about a centreline 94, whereby the drain electrode 80, which is common to both transistor cells 88, 88', is arranged symmetrically at the centreline 94. Each transistor cell 88, 88' includes a source electrode 79 and a gate electrode 81 which is arranged laterally between the source electrode 79 and the drain electrode 80. The source electrode 79, gate 81 and drain electrode 80 of each of the transistor cells 88, 88' have a strip-like elongate form and extend substantially parallel to one another.

At least one conductive through substrate via 82, 82' is arranged laterally adjacent and spaced apart from the source electrode 79 of each transistor cell 88, 88'. A plurality of conductive through substrate vias 82; 82' may be provided for a single conductive connection between the source electrode 79, 79' and the rear surface 84 of the substrate 71. The through substrate vias 82, 82' may be arranged in a row which extends substantially parallel to the source electrode 79, 79' and laterally outward of the source electrode 79, 79' with respect to the centreline 94.

A conductive path is provided from the upper surface 83 to the rear surface 84 by conductive material 86, 86' which is arranged in the through substrate via 82; 82' to form a conductive through substrate vias 85, 85'. The conductive path within the through substrate via 82, 82' may be provided by one conductive portion, as illustrated in FIG. 3a, or two conductive portions 91, 92 of differing shape as is illustrated in FIG. 3b.

A conductive layer 95, 95' is arranged on the upper surface 83 and provides a lateral redistribution of the source connection between the source electrode 79, 79' and the conductive through substrate via 82, 82'. The conductive layer 95 may be part of the first layer of the Back-End Of Line metallization.

In some embodiments, the conductive material 86, 86' within the via 82; 82' may extend onto the upper surface 83 in regions adjacent the via 82, 82' to form a conductive layer 95, 95' which extends onto and is electrically coupled with the source electrode 79, 79'. The conductive layer 95, 95' and conductive material 86, 86' may include high purity copper which may be deposited by electroplating. Such arrangements may be called dual damascene since a single element provides a vertical and lateral electrical path.

In some embodiments, the conductive layer 95, 95' is deposited separately from the conductive material 86, 86' within the via 82. Such arrangements may be called single damascene.

FIG. 4c illustrates a cross-section view of the semiconductor device 30 including a Group III nitride-based transistor 32 arranged in the mesa 37. Side faces of the mesas 37 are embedded in an insulation layer 96 which forms a substantially planar surface 97 with the upper surface of the Group III nitride transistor 32. The via 35 extends through the insulation layer 96 and into the substrate 31 to the rear surface 41 of the substrate 31. The conductive layer 95 extends from the conductive material 36 within the via 35 onto the upper surface 97 of the insulation layer 96 and onto the source electrode 38 to electrically couple the source electrode 38 to the layer 59 arranged on the rear surface 41 of the substrate 31 by way of the conductive through substrate via 34. The conductive layer 95 may be integral with the conductive material 36 or may be provided by a separately deposited conductive layer.

Various structures for partially filled conductive through substrate vias are illustrated in more detail in FIGS. 5a and 5b. The structures are described with reference to the conductive through substrate via 34 illustrated in FIG. 2b.

However, the structures are not limited to use in the semiconductor device 30. For example, they may be used for the conductive via 82 of the semiconductor device 70 illustrated in FIG. 3b.

FIG. 5a illustrates an embodiment of a structure 100 of the conductive material 36 including the conductive liner layer 62 and conductive plug 61 in which the conductive liner layer 62 is positioned directly on the upper surface of the conductive plug 61 forming a substantially horizontal interface 101 between the conductive plug 61 and the conductive liner layer 62. The conductive liner layer 61 may surround a gap 63 within the via 35 which is open at the first surface 33 of the semiconductor substrate 31.

This structure 100 includes an interface 101 between an upper surface of the conductive plug 61 and the lower surface of a base of a U-shaped conductive liner layer 62 and may be produced after deposition of the conductive liner layer 62 on the conductive plug 61.

The conductive liner layer 62 and the conductive plug 61 may have different microstructures. For example, the conductive plug 61 may include a grain size which is larger than a grain size of the conductive liner layer 62. The differing microstructures may result from differing conditions used to deposit the conductive plug 61 and conductive liner layer 62 in the via 34.

In an embodiment, different electrochemical processing baths which include different chemical additive systems are used to deposit the conductive plug 61 and the conductive liner layer 62. The chemical additive system may be identified in the final produce using analytical techniques, such as TOF-SIMS (Time-Of-Flight Secondary Ion Mass Spectrometry).

The conductive liner layer 62 and the conductive plug 61 may include the same material, for example the same metal. In some embodiments, the conductive liner layer 62 and the conductive plug 61 include high purity copper.

The conductive plug 61 has a height $h_2$ which is greater than the thickness t of the conductive liner layer 62, for example, $h_2 \geq 3t$. In some embodiments, 0.5 µm≤t≤3 µm and 5 µm≤$h_2$≤50 µm.

The conductive through substrate via 34 may have a height $h_1$ and the conductive plug 61 may have a height $h_2$ whereby $h_2$ may be less than or equal to $\frac{2}{3}h_1$, i.e. $h_2 \leq 2h_1/3$. In some embodiments, 20 µm$\leq h_1 \leq$100 µm and 5 µm$\leq h_2 \leq$70 µm.

One or more further layers providing adhesion promotion, a diffusion barrier and/or a seed layer may be arranged between the material of the substrate 31 defining the side walls 51 of the via 35, the conductive plug 61 and the conductive liner layer 62.

The conductive through substrate via 34 may be considered to be anisotropically filled as the conductive plug 61 fills the lateral area of the via 35, whereas the conductive liner layer 62 surrounds a gap 63 or void at the centre of the via 35. The anisotropic fill may be used to provide stress relief and simpler processing for a substrate at the wafer level and for a substrate at the device level after singulation from the wafer.

For example, the positioning of gap 63 within the via 35 may be used to prevent bowing of the substrate 31, particularly during fabrication of arrays of conductive through substrate vias 34 at the wafer level, and may be used for stress compensation. The conductive through substrate via 34 may have improved thermal performance during thermal cycling, since the conductive material of the conductive plug 61 and conductive liner layer 62 can expand into the gap 63. Furthermore, the use of the filled base of the conductive through substrate via 34 prevents solder from entering the via during die attach, for example when the rear surface 25 is soldered onto a die pad or ground plane.

The gap 63 positioned within the upper portion of the via 35 may be open at the front surface 33. In some embodiments, the upper end 102 of the conductive via 34 is sealed at the front surface 33 to produce a cavity within the upper portion of the conductive through substrate via 34 and within the conductive liner layer 62. The lateral area of the conductive through substrate via 34 formed by the gap 63 or cavity, if present, may be around 4% of the total surface area of the substrate 31.

FIG. 5b illustrates a structure 103 which may be formed, if the semiconductor substrate 31 is subjected to an annealing treatment during subsequent processing of a device having an arrangement including an interface 101 between an upper surface of the conductive plug 61 and the base of a U-shaped conductive liner layer 62, for example. This subsequent annealing treatment can result in grain growth of the material of the conductive plug 61 and conductive liner layer 62 such that the interface is no longer discernible and a conductive liner layer 62 is formed on the side walls 51 of the via 34 and on the periphery of an upper surface of the conductive plug 61 which has a different microstructure from the conductive plug 61, for example a smaller grain size. In this embodiment, the central portion of the upper surface of the conductive plug 61 forms the base of the gap 63.

FIG. 6 illustrates a flow chart 110 of a method for fabricating a conductive via, such as the conductive through substrate via 34, 82, in a substrate including a Group III nitride-based transistor on a front surface. In block 111, an opening is formed in a front surface of the substrate including the Group III nitride-based transistor arranged on the front surface. In block 112, conductive material is inserted into the opening. In block 113, a source electrode of the Group III nitride-based transistor is coupled to a rear surface of the substrate, the rear surface opposing the front surface.

The opening is arranged in the front surface of the substrate such that it is spaced apart and at a lateral distance from the Group III nitride-based transistor, after the formation of the Group III nitride-based transistor.

In some embodiments, the method further includes epitaxially depositing a first Group III nitride layer having a first bandgap on the front surface of the substrate, epitaxially depositing a second Group III nitride layer having a second bandgap different from the first bandgap on the front surface of the substrate and forming a heterojunction therebetween, forming a metallization structure on the second Group III nitride layer to form a transistor structure, and inserting the opening through the first Group III nitride layer and the second Group III nitride layer and into the front surface of the substrate. The heterojunction may support a two dimensional charge gas which is formed by piezoelectric and spontaneous polarization. The metallization structure may include strip-like metallic electrodes extending substantially parallel to one another to form a gate electrode arranged between a source electrode and a drain electrode. The opening is spaced apart from the metallization structure forming the transistor structure by regions of the first and second Group III nitride layers.

In some embodiments, the Group III nitride based transistor is formed in a mesa arranged on the front surface of the substrate. The mesa includes a first epitaxial Group III nitride layer having a first bandgap and a second epitaxial Group III nitride layer having a second bandgap different from the first bandgap forming a heterojunction therebetween. A plurality of mesas may be arranged on the front surface which are spaced apart from one another. In some embodiments, at least side faces of the mesa are embedded in an insulation layer arranged on the front surface of the substrate. The opening may be formed through the insulation layer and into the front surface of the substrate such that the opening is spaced apart from the Group III nitride layers of the mesas by portions of the insulation layer and the substrate.

In some embodiments, the method further includes applying the conductive material onto the front surface of the substrate such that it extends from the side walls of the opening, onto the front surface and onto the source electrode of the Group III nitride-based transistor.

In some embodiments, a further conductive layer is applied onto the conductive material within the opening and onto the front surface of the substrate such that it electrically couples the source electrode of the Group III nitride-based transistor with the conductive material. The further conductive layer may be arranged above the plane of the Group III nitride-based transistor and be electrically coupled to the source electrode by one or more conductive vias extending between the source electrode and the further conductive layer.

In some embodiments, the opening is substantially filled with the conductive material. The conductive material may be applied by electroplating, for example.

In some embodiments, the opening is partially filled with conductive material. The opening may be partially filled using electroplating to produce two portions of differing shape within the opening.

In some embodiments, conductive material is inserted into the opening using first deposition parameters such that a first conductive layer fills the opening in a first portion. A second conductive layer is formed on the first conductive layer in a second portion of the opening using second deposition parameters such that second conductive layer surrounds a gap in the second portion.

The first conductive layer and the second conductive layer may be formed by electrodeposition techniques. The first conductive layer may form a conductive plug and the second conductive layer may form a conductive liner layer. The second conductive layer may be formed directly on the first conductive layer and form a substantially horizontal interface therebetween. In some embodiments, the second conductive layer may extend from a periphery of the first conductive layer on side walls of the opening. The first and second conductive layers may be distinguishable by their respective microstructures. For example, the first conductive layer may have a larger average grain size than the second conductive layer.

The first deposition parameters may be selected to favour the growth of the first conductive layer in the vertical direction with respect to major surfaces of the substrate and the second deposition parameters may be selected to favour growth of the second conductive layer in a lateral direction with respect to the major surfaces of the substrate. The first and second deposition parameters may be selected such that the first conductive layer has the form of a conductive plug having a height $h_1$ and the second conductive layer has a thickness t, whereby $h_1 \geq 3t$.

In some embodiments, the substrate is subjected to an annealing treatment during subsequent processing of the arrangement. This subsequent annealing treatment can result in grain growth of the material of the first and second conductive layers such that the interface is no longer discernible. However, the portion of the second conductive layer formed on the side walls of the opening and at the periphery of the first conductive layer may have a different microstructure from the first conductive layer, for example a smaller grain size, so that the two conductive layers are discernible.

In some embodiments, the opening has the form of a blind via, or closed-end via, and the first conductive layer is applied to the base of the blind via such that the base portion of the blind via is filled with the first conductive layer. In some embodiments, the blind via is filled to a depth of 10% to 70% of the total depth of the blind via. The second layer may be positioned directly on the first layer to from an interface and extend along the side walls to the open end of the via at the first surface. In some embodiments, the second layer further extends onto the first surface of the semiconductor substrate and is electrically coupled to the Group III nitride-based transistor. In order to provide a conductive path between the front surface and the rear surface of the final substrate, the rear surface adjacent the blind via may be worked to move material until a portion of the conductive plug is exposed and the substrate has the desired thickness.

In some embodiments, the gap in the second portion of the opening is capped after applying the second conductive layer. The gap may be capped by forming a first insulting layer of the second conductive layer that surrounds a gap and forming a second insulation layer over the gap, thereby forming an enclosed and sealed cavity or void within the opening.

After applying the second conductive layer and before applying the metallization structure to the first surface, the gap in the second portion of the opening may be temporarily capped, for example by inserting a resist plug, the front surface planarized, for example by Chemical Mechanical Polishing (CMP) and the resist plug removed.

FIG. 7 illustrates a flow chart of a method 120 for fabricating a Group III nitride-based transistor device. In block 121, a Group III nitride-based transistor is formed on a front surface of a semiconductor substrate. In block 122, a blind via is inserted into the front surface, and conductive material is inserted into the blind via. In block 123, a metallization structure is applied to the front surface which has at least one conductive portion which is electrically coupled between the conductive material within the blind via and the source electrode of the Group III nitride-based transistor and at least one conductive portion coupled to each of the gate electrode and drain electrode of the Group III nitride-based transistor. In block 124, a second surface of the substrate which opposes the first surface and the metallization structure is worked to expose a surface of the conductive material arranged at the base of the via.

The conductive through substrate via is formed after the formation of the Group III nitride-based transistor on the first surface of the substrate and before the deposition of the metallization structure on the front surface. The front surface includes a composition and/or crystallographic orientation which supports the epitaxial growth of a Group III nitride.

The Group III nitride-based transistor may be provided in the form of a discrete mesa arranged on the front surface of the substrate or in a portion of a stack of epitaxial Group III nitride layers extending over substantially the entire front surface. If the Group III nitride-based transistor is provided in a mesa, the opening may be spaced apart and at a distance from a side face of the mesa and be laterally separated from the Group III nitride-based material by a portion of the substrate. The opening may be defined by material of the substrate and of the insulation layer. If the Group III nitride-based transistor is formed in a portion of a stack of Group III nitride layers, the opening may be formed in the stack of the Group III nitride layers such that the stack of Group III nitride layers define a portion of the opening with the material of the substrate defining the remaining portion of the opening.

During insertion of the via into the substrate and the fabrication of the conductive via, the Group III nitride-based transistor may be covered by one or more insulation layers.

The volume of the conductive through substrate via may be filled or partially filled with the conductive material. The volume of the through substrate via may be isotropically or homogeneously filled with the conductive material. Alternatively, the volume of the through substrate via may be anisotropically or inhomogeneously filled with the conductive material.

In embodiments in which the volume of the conductive through substrate via is partially filled with the conductive material, the opening may be a blind via and the base of the blind via may be filled to a predetermined depth with conductive material. A conductive liner layer may be formed in the via above the conductive material which surrounds a gap. The conductive liner layer may extend from, and electrically couple, the conductive material to a source electrode of the Group III nitride-based transistor. The via can be said to be anisotropically filled.

In embodiments, in which the conductive material includes a conductive plug and conductive liner layer, the conductive liner layer may be further formed on the first surface of the substrate surrounding the opening and electrically coupled with a source electrode of the Group III nitride-based transistor.

In some embodiments, the gap surrounded by the conductive liner layer within the via is capped or sealed. The enclosed cavity or void may be defined entirely by insulating material such as a dielectric.

A method for fabricating a Group III nitride-based transistor device will now be described with reference to FIGS. 8 to 14.

FIG. 8 illustrates an initial substrate 130 having a front surface 131. The substrate 130 includes may include a <100> or <111> silicon wafer, or a SiC or sapphire wafer for example and has an initial thickness $t_i$ which is greater than the final thickness of the substrate of the transistor device.

A plurality of mesas 132 is formed on the front surface 131. The mesas 132 are spaced apart by regions 136 in which a conductive through substrate via (TSV) will be formed. The regions 136 may be called passive regions as they do not contribute to the switching function of the transistor device. The mesas 132 include a plurality of epitaxial Group III nitride layers and form a transistor device. The mesas 132 may have the structure illustrated in FIGS. 2 and 3, for example and have side faces embedded in an insulation layer 133. The mesas 132 in the front surface 131 are covered by a first oxide layer 134, for example $SiO_2$, covering the source, gate and drain metal contacts or electrodes, a nitride layer 135, for example SiNx, on the first oxide layer 134 and a second oxide layer 137, for example $SiO_2$, on the nitride layer 135. In the regions 136, the first oxide layer may be omitted and the $SiN_x$ layer 135 and second oxide layer 137 are arranged on the insulation layer 133.

As is illustrated in FIG. 9, a blind via 140 is inserted into the front surface 131 of the substrate 130 in the passive region 136 which is positioned between mesas 132 or active regions 138 in which the transistor is formed.

The blind via 140 has a base 141 formed by a portion of the material of semiconductor substrate 130 and has a depth $t_b$ which is less than the initial thickness $t_i$ of the substrate 130 and which approximates the desired final thickness $t_f$ of the substrate in the Group III nitride-based transistor device. The shape of the base 141 is substantially round. The upper portion of the blind via 140 is defined by the insulation layer 133. The blind via 140 may be inserted into the front surface 131 by reactive ion etching. The blind via 140 is spaced apart from the mesas 132 by a portion of the substrate 131 and insulation layer 133. The second oxide layer 137 and the nitride layer 136 may then be removed from the front surface 131 in the passive region 136.

In plan view, the blind via 140 may have an elongate shape and may be substantially rectangular in the elongate direction, for example. The blind via 140 may be one of a plurality of blind vias which may be arranged in a row extending into the plane of the drawing which extends substantially parallel to the source electrode of the Group III nitride-based transistor 132 or in a regular array arranged between two active regions 138 or mesas 137, each including a Group III nitride-based transistor. The sidewalls 142 of the blind via 140 may be substantially perpendicular to the front surface 131 or may be slightly inclined such that the blind via 140 tapers inwardly in directions towards the base 141. As an example, the blind via 140 may have lateral dimensions of around 8 μm by 50 μm at the front surface 131 and a depth of around 60 μm.

Figure 11:
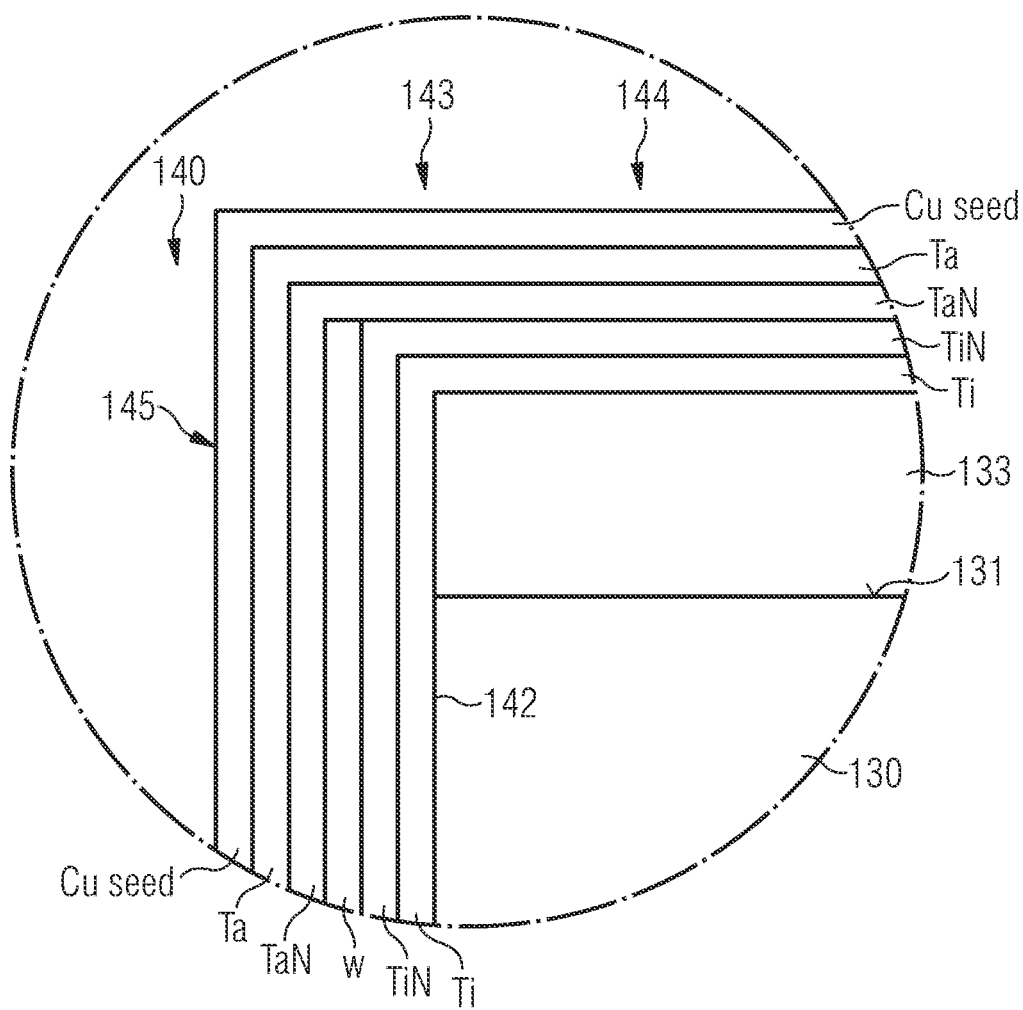
FIG. 11 illustrates an enlarged view of the upper portion of the blind via of FIG. 10.

FIG. 10 illustrates the deposition of a barrier layer structure 143 on sidewalls 142 of the blind via 140 and on the front surface 131 of the substrate 130, in particular on the insulation layer 133. FIG. 11 illustrates the barrier layer structure 143 in more detail. The barrier layer structure 143 may be deposited using Physical Vapour Deposition (PVD) techniques, for example sputtering, and/or Chemical Vapour Deposition (CVD) techniques.

The barrier layer 143 extends over the sidewalls 142 and the base 141 of the blind via 140 and over the insulation layer 133 on the front surface 131 of the substrate 130 in the passive region 136 and over the second oxide layer 137 in the active region 138.

The barrier layer 143 may have various structures, for example a layer of Ta, or layers of Ta/TaN or TaN/Ta or Ti/TiN deposited using PVD or Ti/TiN deposited using PVD and W deposited using CVD or PVD or Ti/TiN deposited using PVD and W/Ta/TaN deposited using CVD or PVD, or Ti/TiN deposited using PVD and W/TaN/Ta deposited using CVD or PVD and optionally further including at least one of the following: a pre-clean, for example, wet chemical HF-last, sputter pre-clean or reduction in hydrogen is done prior to sputtering after deposition of W using CVD, performing a W etch back process to remove W from the planar part of the wafer; and a further copper seed layer deposited by sputtering for copper electroplating.

In some embodiments, as can be seen in the enlarged view of FIG. 11, the portion 144 of the barrier layer 143 arranged on the front surface 131 of the substrate 130 has a different number of layers from the portion 145 arranged on the side walls 142 and the base 141 of the blind via 140. In this embodiment, the portion 144 includes a structure, starting from the insulation layer 133 including layers of Ti, TiN, TaN, Ta, and a Cu seed layer. The second portion 145 includes a structure, starting from a cleaned surface of the semiconductor substrate 131 forming the side walls 142 and base 141 of the blind via 140 including layers of Ti, TiN, W, TaN, Ta, and a Cu seed layer.

After deposition of the barrier layer 143 including the outermost seed layer, conductive material is inserted into the blind via 140, for example by electroplating. In some embodiments, such as that illustrated in FIG. 15, the blind via 140 is filled with conductive material.

In some embodiments such as those illustrated in FIGS. 10 to 13, the conductive material is inserted into the blind via using a two-stage process to produce a partially and anisotropically filled blind via 140.

FIG. 10 illustrates the substrate after the first stage of a two stage process. In the first stage, conductive material is inserted into the base 141 of the blind via 140 to form a first conductive layer 146 which fills the volume of the blind via 140 adjacent the base 141. The first layer 146 may be deposited using electroplating techniques and may be deposited using conditions favouring vertical growth of the layer 146 with respect to the first major surface 131 while suppressing growth of lateral or substrate front side regions such that the volume of the blind via 140 is filled with the first layer 146. The first conductive layer 146 may be called a conductive plug.

Figure 12:
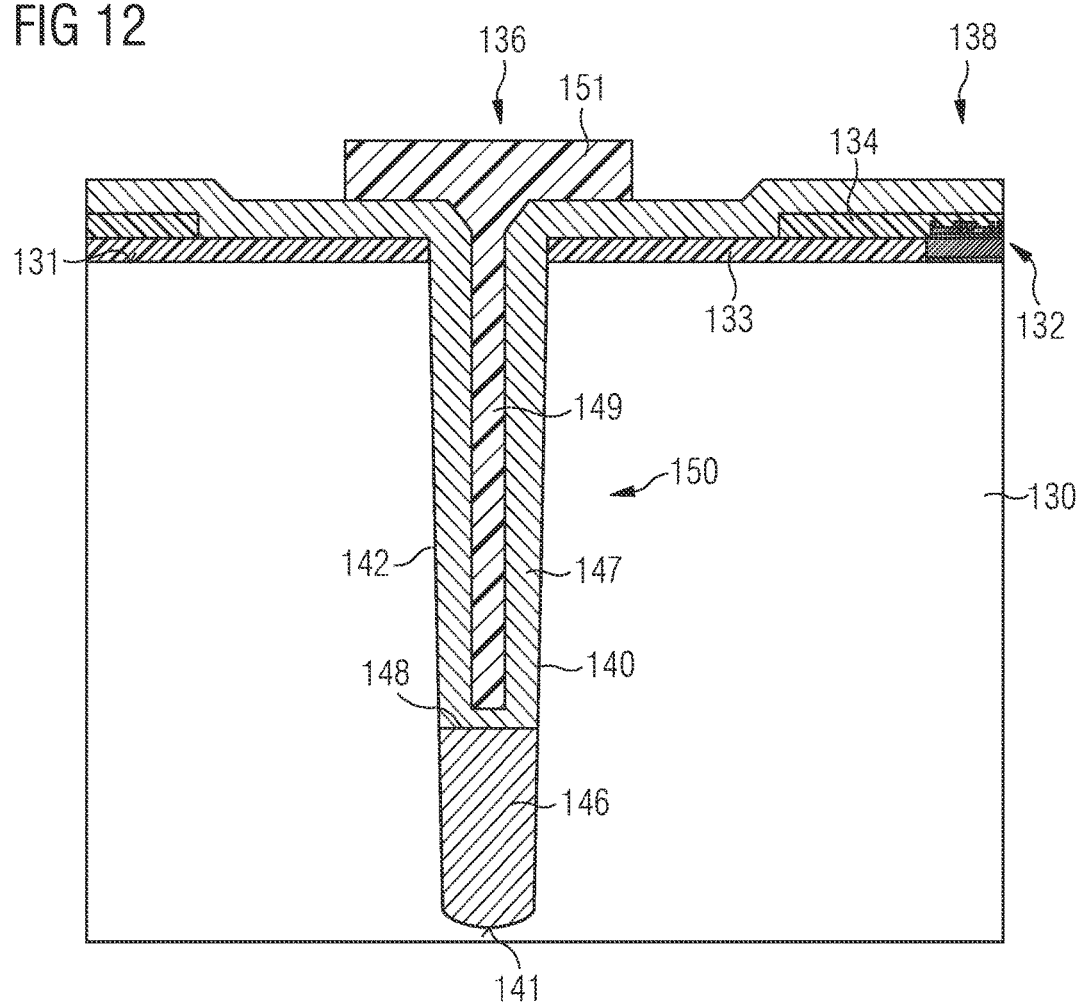
FIG. 12 illustrates a cross-sectional view of a conductive layer arranged on the conductive plug and surrounding a gap which is capped.

FIG. 12 illustrates the substrate 130 after the subsequent deposition of a second conductive layer 147 within the blind via 140. The second conductive layer 147 lines the barrier layer 143 on the sidewalls 142 of the blind via 140, the upper surface of the first layer 146 within the blind via 140 and extends over the front surface 131 of the substrate 130 and the insulation layer 133. The second conductive layer 147 surrounds a gap 149 within the upper portion 150 of the blind via 140.

The second conductive layer 147 may be deposited by electroplating techniques and may be deposited using conditions which favour conformal deposition and growth of the second conductive layer 147 such that the second conductive layer 147 lines the upper portion 150 of the blind via 140 leaving the gap 149 in the centre of the blind via 140. The second conductive layer 147 may be called a conductive liner layer. The first conductive layer 146 and the second conductive layer 147 may include high purity copper.

After deposition, an interface 148 is formed between the first conductive layer 146 and second conductive layer 147. The interface 148 is discernible as the first conductive layer 146 and the second conductive layer 147 are deposited in two deposition steps and may have different microstructures.

In embodiments, in which the substrate is subjected to a subsequent thermal treatment, the interface 148 may no longer be discernible. However, the second conductive layer 147 arranged on side walls 142 of the blind via 140 and the first conductive layer 146 may have different microstructures, such as different grain sizes, and be discernible.

The gap 149 within the bind via 140 may be temporarily sealed using a further material such as a resist 151. A planarization process may be carried out to the front surface with the resist layer 151 preventing material from entering the gap 149 in the blind via 140. The resist layer 151 may then be removed.

The second conductive layer 147 may extend onto the front surface 131 of the substrate 130 and may be electrically coupled to an electrode of the Group III nitride transistor, such as the source electrode. At least portions of the second conductive layer 147 may extend onto and be in direct contact with the source electrode. Since the second layer 147 provides a vertical conductive path within the blind via 140 and a horizontal conductive path on the front surface 131 and as the conductive material providing these two paths is substantially structured using one common chemical mechanical polishing (CMP) process step, the method may be called dual damascene.

In some embodiments, the second conductive layer 147 may extend from the first conductive layer to the outermost surface of the insulation layer 133 and be contained within the via. This method may be called a single damascene method. The second conductive layer may be electrically coupled to the Group III nitride-based transistor, for example the source electrode, by a conductive layer which extends laterally from the via to above the Group III nitride-based transistor and a via that extends vertically from the source electrode to the conductive layer.

Figure 13:
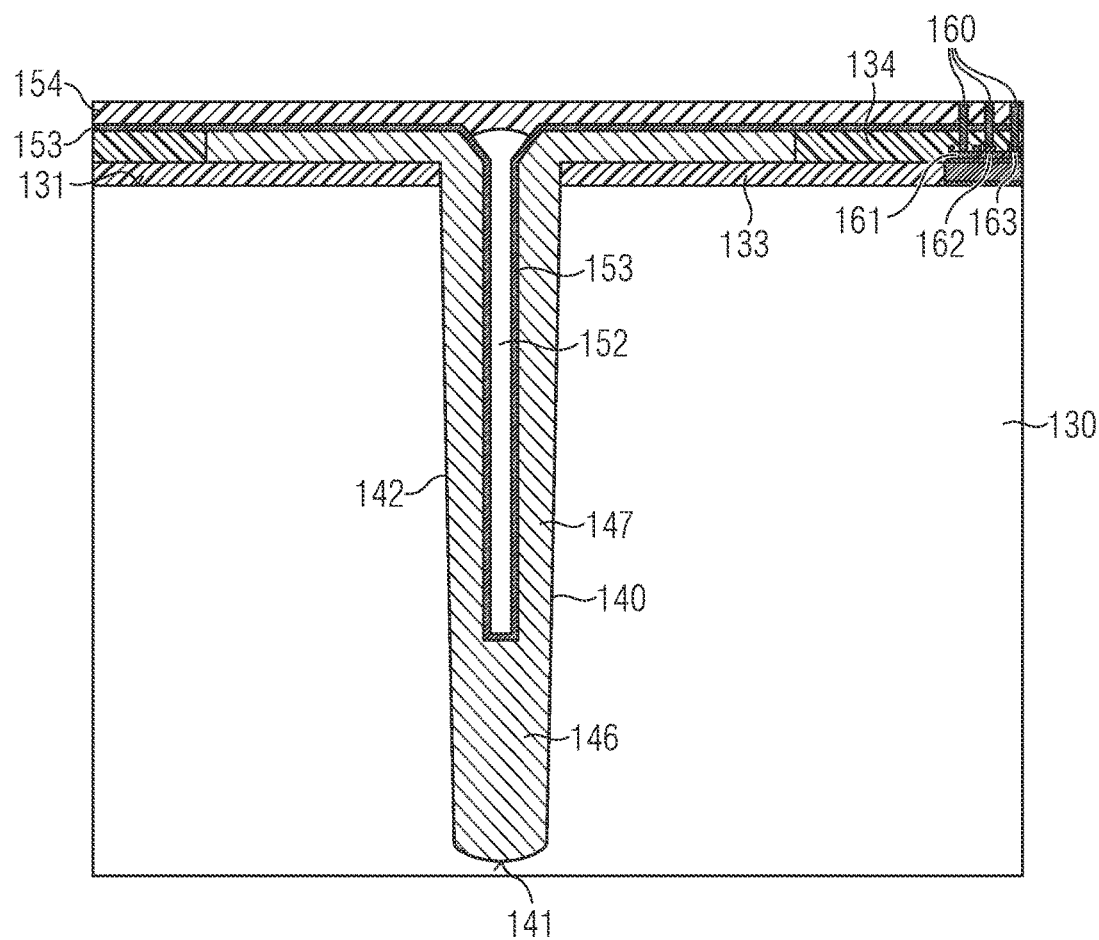
FIG. 13 illustrates a cross-sectional view of a cavity formed in the blind via above the conductive plug.

FIG. 13 illustrates a void or enclosed cavity 152 formed within the upper portion 150 of the blind via 140. The void or enclosed cavity 152 may be defined by dielectric material. The void may be formed by first depositing a silicon nitride layer 153 which lines and passivates the second conductive layer 147 within the blind via 140 and on the front surface 131. The silicon nitride layer 153 may be conformally deposited. A second dielectric layer such as an oxide 154 may be deposited onto the uppermost portion of the blind via 140 such that the oxide layer 154 seals the opening to the blind via 140 and forms a cavity or void 152 with the silicon nitride layer 153 within the blind via 140. The oxide layer 154 may also extend over the Group III nitride-based transistor 131 and form an interlayer dielectric of a metallisation structure which is subsequently deposited on the front surface 131. The oxide layer 154 may also partially cover the silicon nitride layer 153

At least a first level of the BeoL (Back end of line) metallization is formed. Vias 160 are formed through the dielectric layers 134, 153, 154 arranged so as to expose a portion of the source electrode 161, gate electrode 162 and drain electrode 163. The vias 160 may be filled with one or more metals, for example tungsten, with one or more barrier and/or adhesion layers.

Figure 14:
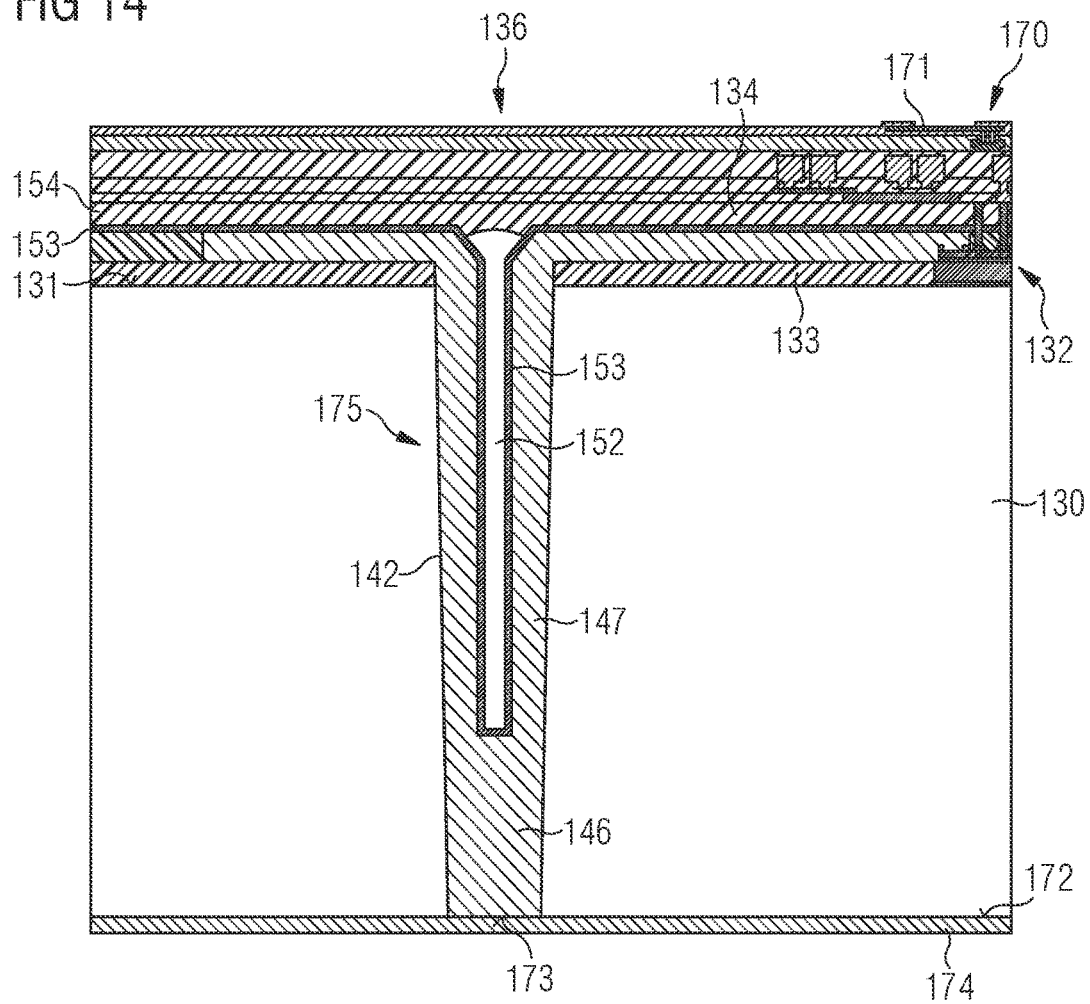
FIG. 14 illustrates a cross-sectional view after formation of a metallization structure on the Group III nitride-based transistor and after working of the rear surface to form a conductive through substrate via.

FIG. 14 illustrates an example of the metallisation structure 170 which may be formed on the front surface 131 to electrically couple the metal contacts of the Group III nitride-based transistors 132 to outer contact pads 171. The metallization structure is a multi-layer metallisation structure.

After the formation of the metallisation structure 170 on the front surface 131, the rear surface 172 of the initial substrate 130 may be worked to remove material, reduce the thickness of the substrate 130 from the initial thickness $t_i$ to a final thickness $t_f$ and expose a surface 173 of the first conductive layer 146 at the base 141 of the blind via 140 such that the surface 173 is exposed in the new rear surface 172 of the substrate 130. The rear surface may be worked by grinding, dry polishing, Chemical Mechanical Polishing or combinations thereof.

One or more conductive layers 174, including for example a solder layer, may be deposited onto the final rear surface 172 which enables the Group III nitride-based transistor device to be mounted on, and electrically coupled to, a further surface such as a flange which provides a ground plane and may also act as a heat sink for the Group III nitride-based transistor device.

The combination of the first conductive layer 146 exposed in the rear surface 172 of the substrate 130 and the second conductive layer 147 which extends onto the front surface 131 and is electrically coupled with the Group III nitride-based transistor 132 and, in particular, the source electrode 161 of the Group III nitride-based transistor 132, provides a conductive through substrate via 175 for the Group III nitride-based transistor device 132. The conductive through substrate via 175 enables the source electrode 161 to be coupled to a surface on the opposing side of the substrate 130.

The conductive through substrate via 175 is partially filled since it includes a dielectric defined cavity 152 in its upper portion. The conductive through substrate via 175 includes a bottom closed metal plane provided by the first conductive layer 146 and a top plane which is partially formed by the dielectric layer 154 sealing the cavity 152. The closed metal plane at the bottom prevents contamination of the via 175 during working of the rear surface 172 and the cavity 152 provides an expansion volume to compensate for thermal stress.

FIG. 14 also illustrates a cross-sectional view of the substrate 130 in which the lateral connection between the conductive material within the via 140 and the source electrode 161 of the Group III nitride-based transistor 132 is illustrated.

The conductive through substrate via 175 extends through the insulation layer 133 which is arranged in the passive regions 136 adjacent the Group III nitride-based transistor 132. The insulation layer 133 is substantially coplanar with an upper surface of the Group III nitride-based transistor 132. The second conductive layer 147 which is arranged on sidewalls of the via 140 extends onto the upper surface of insulation layer 133 and onto at least portions of the source electrode 161 to electrically couple the source electrode 161 to the rear surface of the substrate 130.

The metallisation structure 170 may include a plurality of dielectric layers and conductive layers to provide a conductive redistribution structure for each of the gate electrode 162 and drain electrode 163 and optionally the source electrode 161, to the outermost surface of the metallization structure 170.

Figure 15:
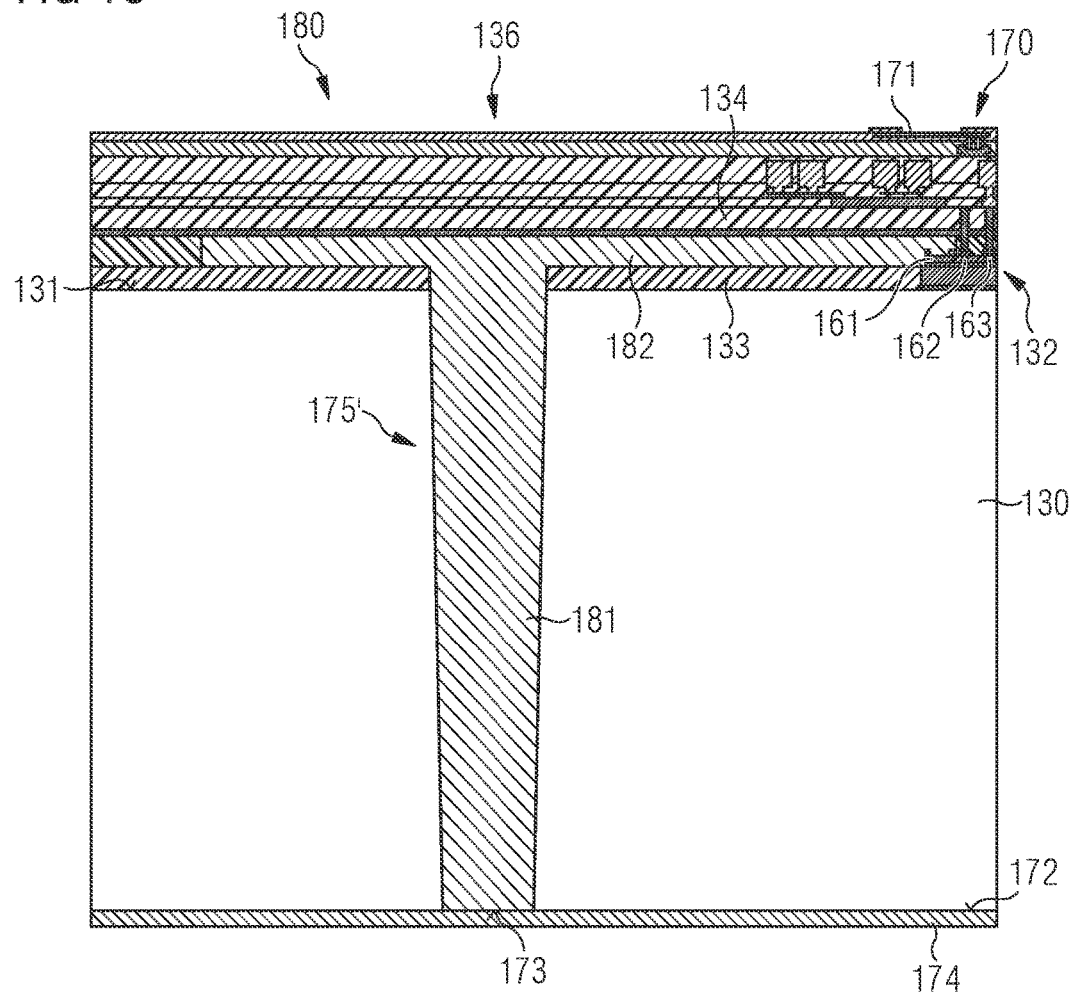
FIG. 15 illustrates a cross-sectional view of a semiconductor device with a Group III nitride-based transistor coupled to a conductive through substrate via that is substantially filled using a dual damascene technique.

FIG. 15 illustrates a cross-sectional view of a semiconductor device 180 which includes the substrate 130, Group III nitride-based transistor 132 on the front surface 133, and at least one conductive through substrate via 175' which extends from the front surface 131 to the rear surface 172. The semiconductor device 180 also includes a metallisation structure 170 arranged on the front surface 131 as the embodiment illustrated in FIG. 14. The semiconductor device 180 differs from that illustrated in FIG. 14 in the arrangement of the conductive material 181 within the via 140. In the embodiment illustrated in FIG. 15, the conductive through substrate via 175' is substantially filled with conductive material, such as high purity copper. As in the embodiment illustrated in FIG. 14, the conductive material 181 extends laterally onto the front surface 131 of the substrate 130 forming layer 182 and, in particular, extends onto the insulation layer 133 in the passive regions 136. The conductive material 181 extends to and is electrically coupled with the source electrode 161 of the Group III nitride-based transistor 132.

Figure 16:
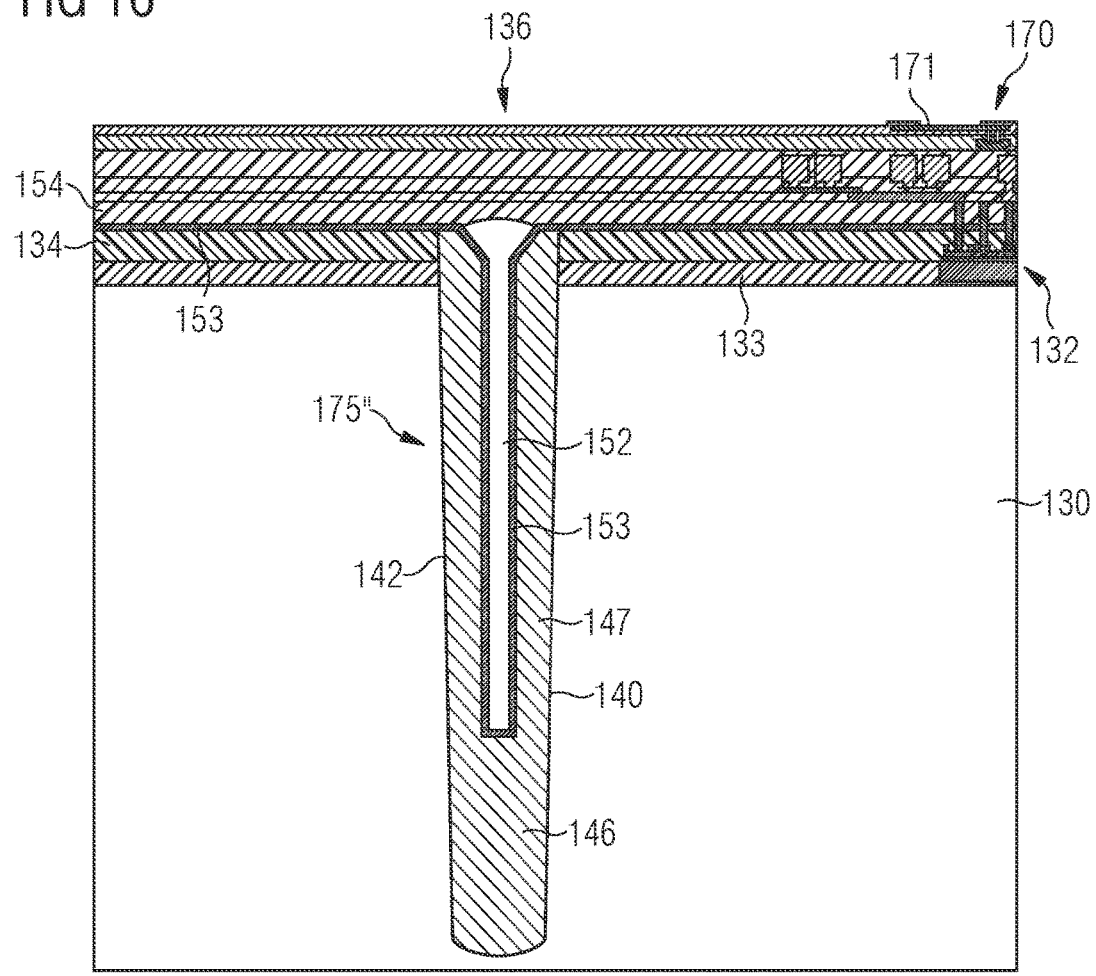
FIG. 16 illustrates a cross-sectional view of a semiconductor device with a Group III nitride-based transistor coupled to a conductive through substrate via formed by a single damascene technique.

FIG. 16 illustrates an alternative structure for the conductive through substrate via 175" which may be described as a single Damascene process. The conductive material is contained within the blind via 140 and provides only a vertical conductive path. In this embodiment, the blind via is filled with the conductive material. In this embodiment, the blind via 140 is formed through not only the insulation layer 133 which is arranged on the front surface 131 of the substrate 130 and which has an upper surface which is substantially coplanar with the upper surface of the Group III nitride-based transistor 132 but also through a further insulation layer 154 which is arranged on the insulation layer 133 and on the upper surface of the Group III nitride-based transistor 132. The further insulation layer 154 covers the source electrode 161, the gate electrode 162 and the drain electrode 163.

In the embodiment illustrated in FIG. 16, the conductive through substrate via 175" is partially filled such that a gap 152 is provided in the upper portion of the conductive through substrate via 175" which is capped by a further insulation layer 154 which extends over the conductive through substrate via 175" and the Group III nitride-based transistor 132 to form a void or cavity 152 within the via 175". The conductive through substrate via 175" provides only a vertical conductive path in this embodiment. An electrical connection between the conductive though substrate via 175" and the Group III nitride-based transistor 132, for example the source electrode 161, may be provided by a further conductive layer and via through the insulation layer 134 above the source electrode 161 which cannot be seen in the cross-sectional view of FIG. 16. The further conductive layer and via may be provided by a portion of the metallisation structure 170.

Figure 17:
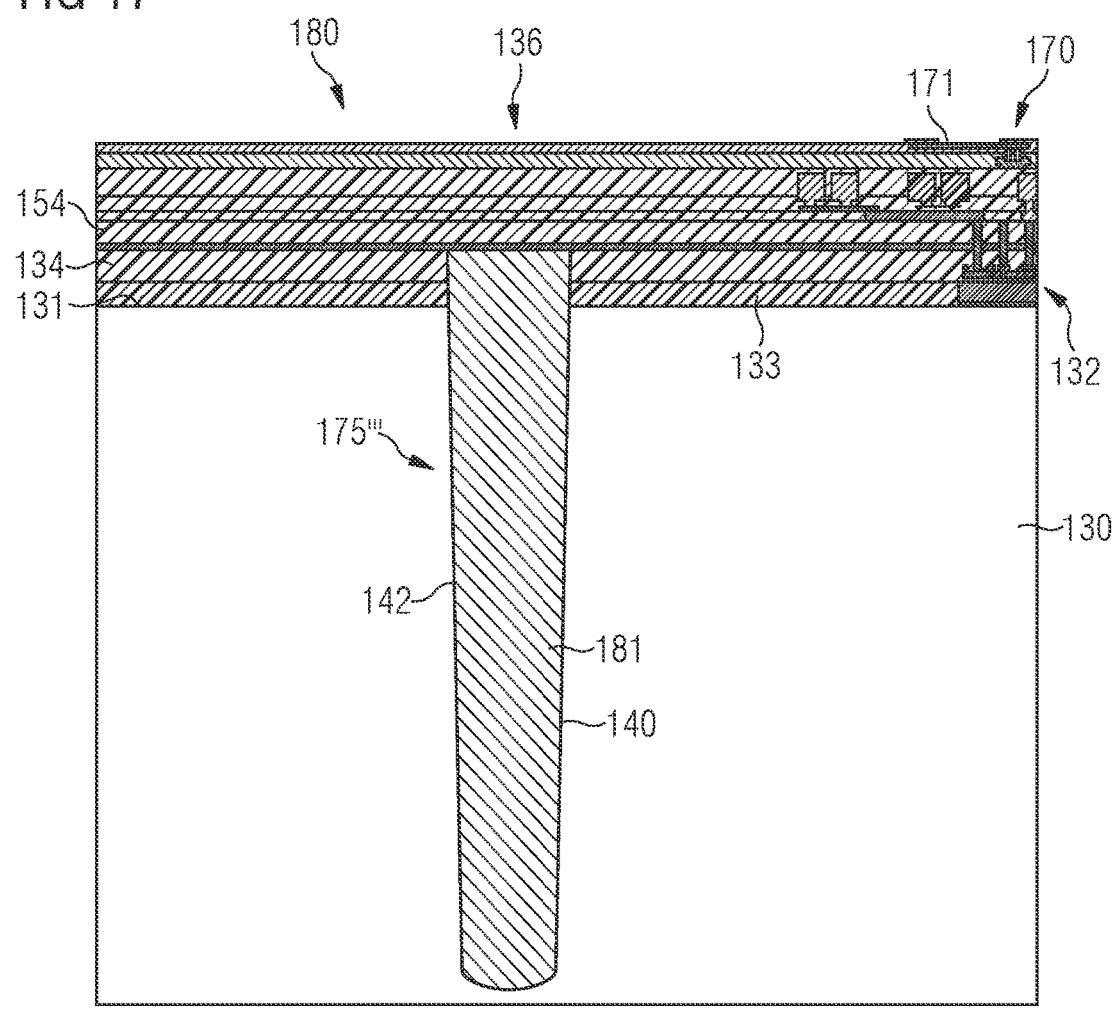
FIG. 17 illustrates a cross-sectional view of a semiconductor device with a Group III nitride-based transistor coupled to a conductive through substrate via formed by a single damascene technique.

FIG. 17 illustrates the semiconductor device 180 with an alternative arrangement of the conductive material 181 in the blind via 140 fabricated using a single damascene technique. The through substrate via 175''' is substantially filled with conductive material 181 which extends through the insulation layers 133 and 134 and which is contained within the blind via 140.

In some embodiments, the conductive through substrate via is partially defined by the Group III nitride layers forming the transistor device. The conductive through substrate via may be formed within the cell field of the transistor device.

Figure 18:
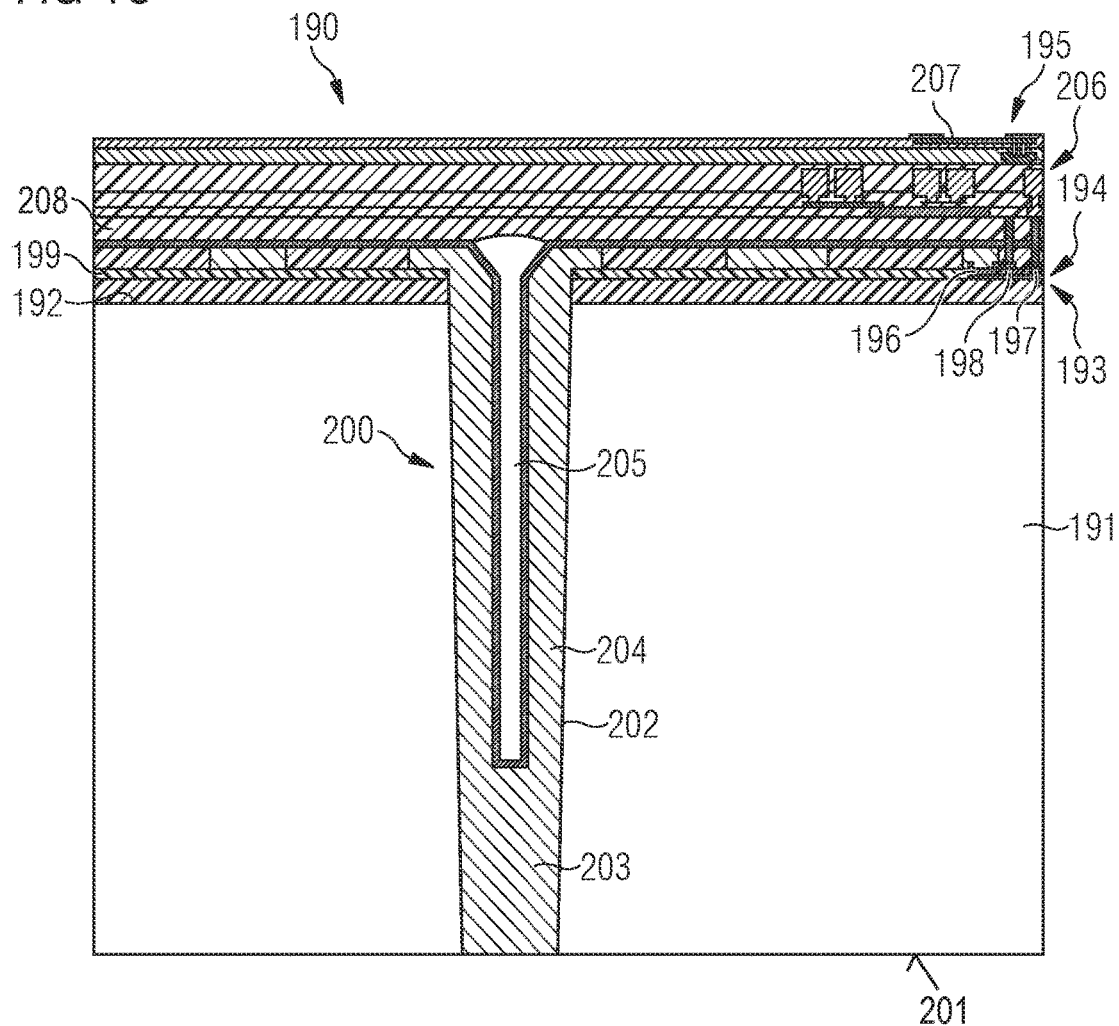
FIG. 18 illustrates a cross-sectional view of a semiconductor device with a Group III nitride-based transistor and conductive through substrate via formed in a plurality of epitaxial Group III nitride layers using a dual damascene technique.

FIG. 18 illustrates a cross-sectional view of a semiconductor device 190 including a substrate 191 having a front surface 192 on which a plurality of epitaxial Group III nitride layers 193 are deposited. The plurality of Group III nitride layers 193 includes a barrier layer and a channel layer forming a heterojunction which is capable of supporting a two-dimensional charge gas.

A transistor structure 194 is formed in a portion 195 of the plurality of Group III nitride layers 193 by a source electrode 196, a drain electrode 197 and a gate electrode 198 which are arranged on the plurality of epitaxial Group III nitride layers 193. The gate electrode 198 is arranged laterally between source electrode 196 and the drain electrode 197. The transistor structure 194 may be one of a plurality of transistor cells coupled in parallel. The semiconductor device 190 also includes a conductive through substrate via 200 which is arranged laterally adjacent the source electrode 196 and spaced apart from the source electrode 196 by a region of the substrate 191. The uppermost surface of the plurality of Group III nitride layers 193 may include one or more passivation and or insulation layers 199. The conductive through substrate via 200 extends through the insulation layer 199, through the plurality of Group III nitride layers 193 into the substrate 191 and extends to the rear surface 201.

The conductive though substrate via 200 may have different forms. In the embodiment illustrated in FIG. 18, the conductive though substrate via 200 includes a via 202 which is partially filled with conductive material, for example high purity copper. The base of the via 202 is substantially filled with conductive material to form a conductive plug 203 whereas upper portion of the via 202 is lined with a conductive liner layer 204 which surrounds and defines a gap 205. The conductive liner layer 204 extends through the upper portion of the via that is bounded by the plurality of Group III nitride layers 193 and onto the upper surface of the plurality of Group III nitride layers 193 adjacent the via 202. Therefore, the conductive through substrate via 200 includes a vertical conductive path from the base of the via 202 to the upper surface of the plurality of Groups III nitride layers 193 and a lateral conductive path substantially perpendicular to the via 202 from the via 202 in the direction of the Group III nitride-based transistor 194. The gap 205 may be sealed by an insulating layer 208 to form a closed cavity within the conductive through substrate via 200.

The semiconductor device 190 also includes a multi-layer metallisation structure 206 which is arranged on the passivation layer 199 and provides a conductive redistribution structure from the electrodes, such as the drain electrode 197 and gate electrode 198 and optionally the source electrode 196, of the Group III nitride-based transistor 194 to outermost contact pads 207 arranged on the front surface 192.

The conductive through substrate via 200 may be positioned laterally between two adjacent Group III nitride-based transistors. In some embodiments, the Group III nitride-based transistor 194 is one of a plurality of transistor cells which are coupled in parallel to produce a single switching device. The electrodes 196, 197 198 may have a strip like form and extend substantially parallel to one another into the plane of the drawing. The regions of the plurality of Group III nitride layers arranged between the source electrodes 196 of neighbouring transistor cells may be termed passive regions, since they do not contribute towards the volume of Group III nitride-based layers 193 providing a switching function. The conductive through substrate via 200 may be one of a plurality of conductive though substrate vias arranged in a row or array which extends substantially parallel to the source electrode 196 into the plane of the drawing. One or more conductive though substrate vias 200 may be coupled to a common source electrode 196. In some embodiments, one or more conductive through substrate vias 200 are electrically coupled to a source electrode of two neighbouring transistor cells arranged on opposing sides of the conductive through substrate via 200.

Figure 19:
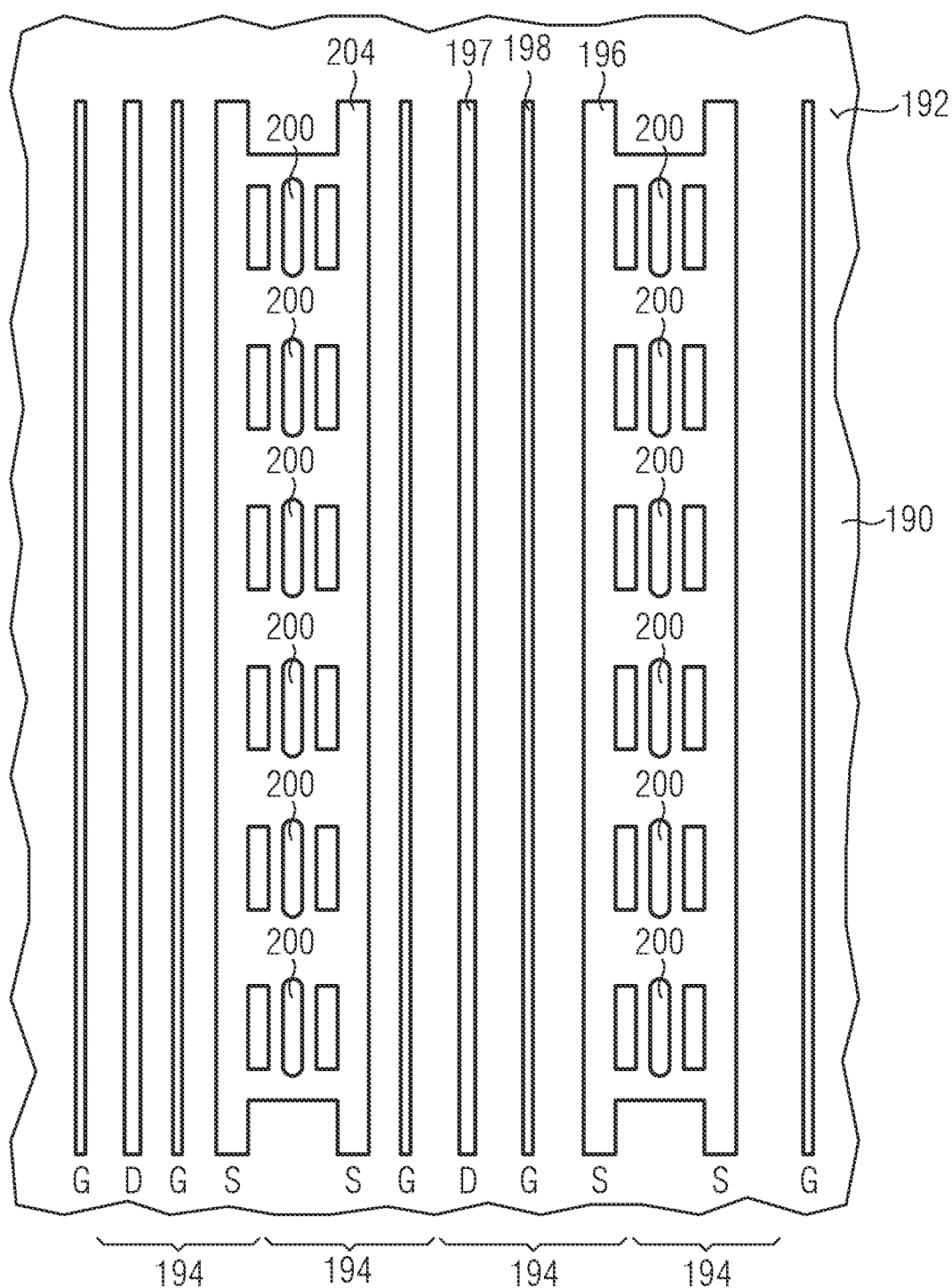
FIG. 19 illustrates a plan view of the semiconductor device of FIG. 18.

FIG. 19 illustrates a plan view of the semiconductor device 190. Source electrode 196, drain electrode 197 and gate electrode 197 have a strip like form and extend substantially parallel to one another. The conductive through substrate vias 200 are arranged in a row extending substantially parallel to source electrodes 196 of neighbouring transistor structures 194. The conductive through substrate vias 200 are electrically coupled by regions of the conductive layer 204 arranged on the front surface 193 to one another and to the source electrodes 196.

Figure 20:
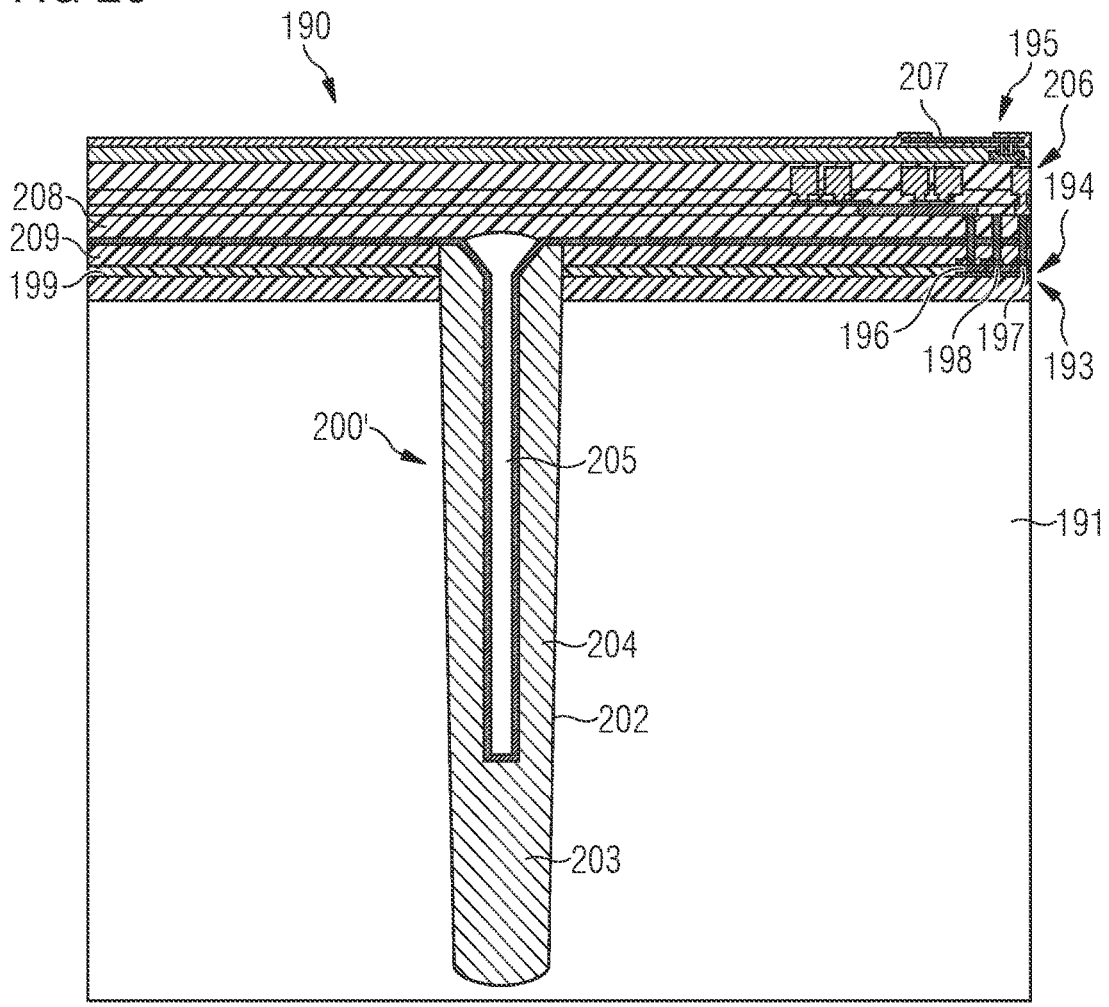
FIG. 20 illustrates a cross-sectional view of a semiconductor device with a Group III nitride-based transistor and conductive through substrate via formed in a plurality of epitaxial Group III nitride layers by a single damascene technique.

FIG. 20 illustrates an alternative structure for the conductive through substrate via 200'. The via 202 extends through an insulation layer 209 which is arranged on the plurality of Group III nitride layers 193 as well as through the plurality of Group III nitride layers 193 and the substrate 191 as the embodiment illustrated in FIG. 18. In this embodiment, the conductive liner layer 204 is arranged entirely within the via 202 and provides only a vertical conductive path. The conductive through substrate via 200' may be electrically coupled to the Group III nitride-based transistor 194 by one or more portions of the metallisation structure 206, for example.

Figure 21:
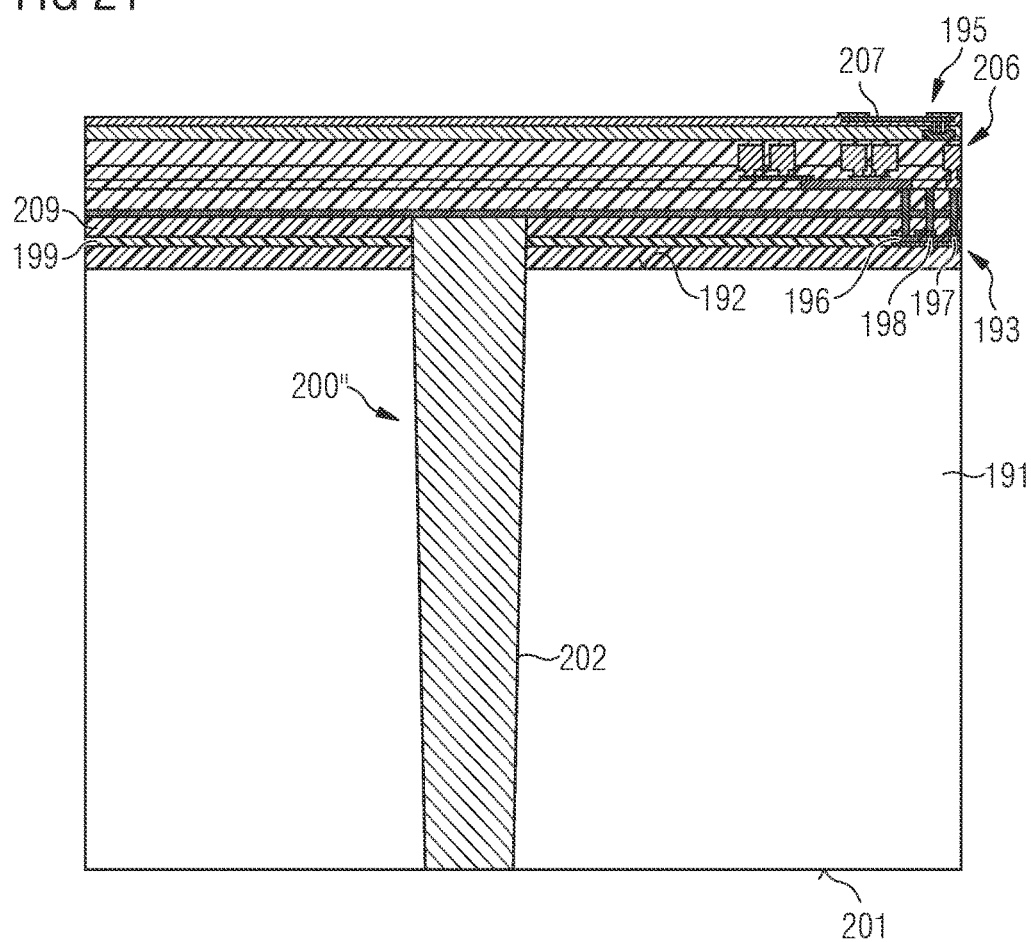
FIG. 21 illustrates a cross-sectional view of a semiconductor device with a Group III nitride-based transistor and conductive through substrate via formed in a plurality of epitaxial Group III nitride layers by a single damascene technique.

In some embodiments, the conductive though substrate via 200" may also be substantially filled with conductive material, as is illustrated in FIG. 21.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    forming an opening in a front surface of a substrate comprising at least one Group III nitride-based transistor on the front surface;
    inserting conductive material into the opening; and
    coupling a source electrode of the Group III nitride-based transistor to a rear surface of the substrate with the conductive material,
    epitaxially depositing a first Group III nitride layer having a first bandgap on the front surface of the substrate;
    epitaxially depositing a second Group III nitride layer having a second bandgap different from the first bandgap on the front surface of the substrate so as to form a heterojunction between the first Group III nitride layer and the second Group III nitride layer;
    forming a metallization structure on the second Group III nitride layer so as to form a transistor structure; and
    inserting the opening through the first Group III nitride layer and the second Group III nitride layer and into the front surface of the substrate.

2. The method of claim 1, wherein the opening is a blind via, the conductive material is inserted into the blind via and material is removed from the rear surface of the substrate to expose a surface of the conductive material and produce a conductive through substrate via.

3. The method of claim 1, wherein the Group III nitride based transistor is formed in a mesa arranged on the front surface of the substrate, the mesa comprising a first epitaxial Group III nitride layer having a first bandgap and a second epitaxial Group III nitride layer having a second bandgap different from the first bandgap with a heterojunction therebetween, wherein the mesa is embedded in an insulation layer arranged on the front surface of the substrate, and wherein the opening is inserted through the insulation layer and into the front surface of the substrate.

4. The method of claim 1, further comprising:
    applying a metallization structure to the front surface of the substrate;
    removing material from the rear surface of the substrate so as to expose a surface of the conductive material; and
    applying a conductive layer to the rear surface.

5. The method of claim 1, further comprising forming the conductive material on the front surface of the substrate adjacent the opening.

6. The method of claim 5, further comprising forming the conductive material on a conductive layer arranged on the front surface that is electrically coupled with a source electrode of the Group III nitride-based transistor.

7. The method of claim 1, wherein inserting the conductive material into the opening comprises substantially filling the opening with the conductive material.

8. The method of claim 7, wherein the conductive material is inserted by electroplating.

9. A method, comprising:
    forming an opening in a front surface of a substrate comprising at least one Group III nitride-based transistor on the front surface;
    inserting conductive material into the opening; and
    coupling a source electrode of the Group III nitride-based transistor to a rear surface of the substrate with the conductive material,
    wherein inserting the conductive material into the opening comprises:
        forming a first conductive layer in a first portion of the opening in the substrate using first deposition parameters such that the first conductive layer fills the opening in the first portion; and
        forming a second conductive layer on the first conductive layer in a second portion of the opening using second deposition parameters such that the second conductive layer bounds a gap in the second portion.

10. The method of claim 9, wherein the first deposition parameters are selected so as to favour growth of the first conductive layer in a vertical direction with respect to a major surface of the substrate and the second deposition parameters are selected so as to favour growth of the second conductive layer in a lateral direction with respect to the major surface of the substrate.

11. The method of claim 9, wherein the first conductive layer and the second conductive layer are formed by electroplating.

12. The method of claim 9, wherein the opening is a blind via, the first conductive layer is applied to a base of the blind via and the base of the blind via is filled with the first conductive layer.

13. The method of claim 12, wherein the first conductive layer fills the blind via to a depth of 10% to 70% of a total depth of the blind via.

14. The method of claim 9, further comprising:
after applying the second conductive layer, capping the gap in the second portion of the opening.

15. The method of claim 9, further comprising forming a first insulation layer over the second conductive layer that surrounds a gap and forming a second insulation layer over the gap so as to form an enclosed cavity within the opening.

16. The method of claim 9, wherein the opening is a blind via, the conductive material is inserted into the blind via and material is removed from the rear surface of the substrate to expose a surface of the conductive material and produce a conductive through substrate via.

17. The method of claim 9, further comprising:
epitaxially depositing a first Group III nitride layer having a first bandgap on the front surface of the substrate;
epitaxially depositing a second Group III nitride layer having a second bandgap different from the first bandgap on the front surface of the substrate so as to form a heterojunction between the first Group III nitride layer and the second Group III nitride layer;
forming a metallization structure on the second Group III nitride layer so as to form a transistor structure; and
inserting the opening through the first Group III nitride layer and the second Group III nitride layer and into the front surface of the substrate.

18. The method of claim 9, wherein the Group III nitride based transistor is formed in a mesa arranged on the front surface of the substrate, the mesa comprising a first epitaxial Group III nitride layer having a first bandgap and a second epitaxial Group III nitride layer having a second bandgap different from the first bandgap with a heterojunction therebetween, wherein the mesa is embedded in an insulation layer arranged on the front surface of the substrate, and wherein the opening is inserted through the insulation layer and into the front surface of the substrate.

19. The method of claim 9, further comprising:
applying a metallization structure to the front surface of the substrate;
removing material from the rear surface of the substrate so as to expose a surface of the conductive material; and
applying a conductive layer to the rear surface.

20. The method of claim 9, further comprising forming the conductive material on the front surface of the substrate adjacent the opening.

* * * * *